(12) United States Patent
Mizukami

(10) Patent No.: US 8,733,904 B2
(45) Date of Patent: May 27, 2014

(54) ELECTRO-MECHANICAL TRANSDUCER, METHOD OF MAKING THE TRANSDUCER, LIQUID EJECTION HEAD INCLUDING THE TRANSDUCER, AND LIQUID EJECTION APPARATUS INCLUDING THE HEAD

(75) Inventor: Satoshi Mizukami, Sagamihara (JP)

(73) Assignee: Ricoh Company, Limited, Tokyo (JP)

( * ) Notice: Subject to any disclaimer, the term of this patent is extended or adjusted under 35 U.S.C. 154(b) by 257 days.

(21) Appl. No.: 12/908,409

(22) Filed: Oct. 20, 2010

(65) Prior Publication Data

US 2011/0090289 A1    Apr. 21, 2011

(30) Foreign Application Priority Data

Oct. 21, 2009    (JP) ................................. 2009-242170

(51) Int. Cl.
*B41J 2/045* (2006.01)
(52) U.S. Cl.
USPC ........................................................ 347/68
(58) Field of Classification Search
None
See application file for complete search history.

(56) References Cited

U.S. PATENT DOCUMENTS

| 7,891,783 B2 * | 2/2011 | Tsuda ............................. 347/70 |
| 2007/0013268 A1 * | 1/2007 | Kubo et al. .................... 310/324 |

FOREIGN PATENT DOCUMENTS

| JP | 3019845 | 1/2000 |
| JP | 3365485 | 11/2002 |
| JP | 2005-135975 A | 5/2005 |
| JP | 2006-60079 | 3/2006 |
| JP | 2006-217721 A | 8/2006 |
| JP | 2007-048816 A | 2/2007 |
| JP | 2007-088442 A | 4/2007 |
| JP | 2008-005464 A | 1/2008 |
| JP | 4218309 | 11/2008 |
| JP | 2009-226796 A | 10/2009 |

* cited by examiner

*Primary Examiner* — Matthew Luu
*Assistant Examiner* — Erica Lin
(74) *Attorney, Agent, or Firm* — Oblon, Spivak, McClelland, Maier & Neustadt, L.L.P.

(57) ABSTRACT

An electro-mechanical transducer includes a plurality of independent elements. Each of the plurality of independent elements includes one of a substrate and a foundation film, a first electrode of oxide disposed on the one of the substrate and the foundation film, an electro-mechanical transducer film disposed on the first electrode, a second electrode of oxide disposed on the electro-mechanical transducer film, and a third electrode of metal formed on the first electrode as a common electrode conductive to the first electrode and common to at least two of the plurality of independent elements.

17 Claims, 10 Drawing Sheets

ELECTRO-MECHANICAL TRANSDUCER, METHOD OF MAKING THE TRANSDUCER, LIQUID EJECTION HEAD INCLUDING THE TRANSDUCER, AND LIQUID EJECTION APPARATUS INCLUDING THE HEAD

CROSS-REFERENCE TO RELATED APPLICATIONS

The present patent application claims priority pursuant to 35 U.S.C. §119 from Japanese Patent Application No. 2009-242170, filed on Oct. 21, 2009 in the Japan Patent Office, which is incorporated herein by reference in its entirety.

BACKGROUND OF THE DISCLOSURE

1. Field of the Disclosure

Exemplary embodiments of the present disclosure relate to an electro-mechanical transducer usable as a piezoelectric actuator of an inkjet recording head, a liquid ejection head including the electro-mechanical transducer, and a liquid ejection apparatus including the liquid ejection head.

2. Description of the Background

Image forming apparatuses are used as printers, facsimile machines, copiers, plotters, or multi-functional peripherals having two or more of the foregoing capabilities. As one type of image forming apparatus employing a liquid-ejection recording method, an inkjet recording apparatus is known that uses a recording head formed with a liquid ejection head (liquid-droplet ejection head) for ejecting droplets of ink.

For example, such a liquid-ejection head (inkjet recording head) of the inkjet recording apparatus may have a configuration like that illustrated in FIG. 1. In FIG. 1, the liquid-ejection head includes a nozzle 102 through which ink droplets are ejected, a pressure chamber 101 (also referred to as, for example, a pressure chamber, ink channel, pressurization liquid chamber, or liquid chamber) connected to the nozzle 102, an electro-mechanical transducer 109, such as a piezoelectric element that pressurizes ink within the pressure chamber 101 (or an electro-thermal conversion element such as a heater), a diaphragm foundation member 105 that forms a wall surface of an ink channel, and an energy generator formed with electrodes facing the diaphragm 105. The energy generator generates energy to compress the ink in the pressure chamber 101, thereby ejecting ink droplets from the nozzle 102. In FIG. 1, a voltage is applied to a lower electrode 106 and an upper electrode 108 of the electro-mechanical transducer 109 to vibrate the electro-mechanical transducer 109, thereby generating the above-mentioned energy. The liquid ejection head further includes a nozzle plate 103, a pressure-chamber substrate (Si substrate) 104, and an electro-mechanical transducer film 107.

Two types of inkjet recording heads are in practical use: an inkjet recording head using a vertical-vibration-type piezoelectric actuator that extends and contracts in an axial direction of an electro-mechanical transducer, and an inkjet recording head using a flexural-vibration-type piezoelectric actuator.

For an inkjet recording head using a flexural-vibration-type piezoelectric actuator, for example, a piezoelectric material layer is uniformly formed over a whole surface of a diaphragm by coating and the piezoelectric material layer is cut into a shape corresponding to a pressure chamber by lithography to form a piezoelectric element, so that pressure chambers are separated from each other.

The piezoelectric element used in the flexural-vibration-type piezoelectric actuator includes, for example, a lower electrode serving as a common electrode common to multiple elements, a lead zirconate titanate (PZT) film (piezoelectric layer) on the lower electrode, an upper electrode serving as an independent electrode formed on the PZT film, an interlayer insulation film formed on the upper electrode that insulates the lower electrode from the upper electrode, and a wire electrically connected to the upper electrode via a contact hole formed in the interlayer insulation film (for example, as in JP-3365485-B and JP-4218309-B.

However, the lower electrode serving as the common electrode described in an exemplary embodiment of the above-mentioned patent documents is a metal electrode containing, for example, Pt. Such an electrode may deteriorate due to dispersion of lead (Pb) contained in PZT, which may degrade fatigue resistance. Further, the desired cohesion of the metal electrode with the piezoelectric layer may not be obtained, causing reduced reliability.

Alternatively, to reduce initial flexure of a diaphragm constituting an inkjet recording head, JP-3019845-B proposes a piezoelectric element (including a lower electrode, a piezoelectric layer, and an upper electrode) that is formed via a diaphragm and in which at least one layer used together the piezoelectric layer is a compression film having compression stress, in which the compression film is a metal oxide film to prevent dispersion of lead.

However, in a case in which the lower electrode is a metal oxide film, the lower electrode is commonly provided for a plurality of piezoelectric elements. Consequently, when the plurality of piezoelectric elements is simultaneously driven to eject a large number of ink droplets at a time, the resulting voltage drop can destabilize the degree of displacement of the independent piezoelectric elements, thus degrading ink ejection characteristics. Further, in a case in which the lower electrode is an oxide electrode, the specific resistance value of the oxide electrode is approximately $10^1$ to $10^3$ times greater than that of the metal electrode, which may easily cause the above-described degraded ejection characteristics.

SUMMARY

In an aspect of this disclosure, there is provided an improved electro-mechanical transducer including a plurality of independent elements. Each of the plurality of independent elements includes one of a substrate and a foundation film, a first electrode of oxide disposed on the one of the substrate and the foundation film, an electro-mechanical transducer film disposed on the first electrode, a second electrode of oxide disposed on the electro-mechanical transducer film, and a third electrode of metal formed on the first electrode as a common electrode conductive to the first electrode and common to at least two of the plurality of independent elements.

In an aspect of this disclosure, there is provided an improved method of making an electro-mechanical transducer including a plurality of independent elements. The method includes providing a substrate or a foundation film, forming a first electrode of oxide on the substrate or the foundation film, forming an electro-mechanical transducer film on the first electrode, forming a second electrode of oxide on the electro-mechanical transducer film, forming a third electrode of metal on the first electrode as a common electrode conductive to the first electrode and common to at least two of the plurality of independent elements, and forming an insulation film on a surface of the plurality of independent elements, the insulation film having at least one of a first hole at the first electrode, through which the first electrode is connected to the third electrode, and a second hole at the second electrode, through which the second electrode contacts an external connector.

In an aspect of this disclosure, there is provided an improved liquid ejection head including an electro-mechanical transducer. The transducer includes a plurality of independent elements. Each of the plurality of independent elements includes one of a substrate and a foundation film, a first electrode of oxide disposed on the one of the substrate and the foundation film, an electro-mechanical transducer film disposed on the first electrode, a second electrode of oxide disposed on the electro-mechanical transducer film, and a third electrode of metal formed on the first electrode as a common electrode conductive to the first electrode and common to at least two of the plurality of independent elements.

BRIEF DESCRIPTION OF THE DRAWINGS

Additional aspects, features, and advantages of the present disclosure will be readily ascertained as the same becomes better understood by reference to the following detailed description when considered in connection with the accompanying drawings, wherein.

Figure 1:
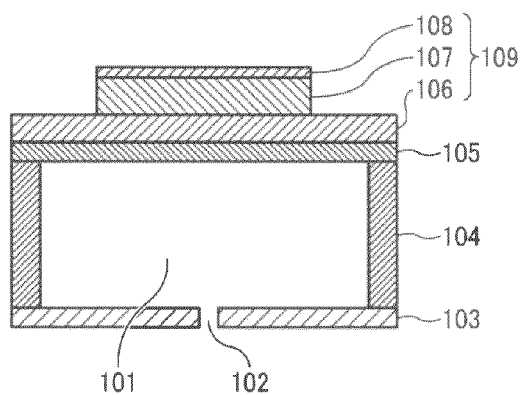
FIG. 1 is a schematic view of a configuration of an inkjet recording head.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION OF EXEMPLARY EMBODIMENTS

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the exemplary embodiments are described with technical limitations with reference to the attached drawings, such description is not intended to limit the scope of the invention and all of the components or elements described in the exemplary embodiments of this disclosure are not necessarily indispensable to the present invention.

An electro-mechanical transducer according to exemplary embodiments of the present disclosure includes a plurality of independent elements, each of which is formed with a first electrode made of oxide on a substrate or foundation film, an electro-mechanical transducer film on the first electrode, and a second electrode made of oxide on the electro-mechanical transducer. A third electrode made of metal is formed at the first electrode as a common electrode conductive to the first electrode and common to at least two of the plurality of independent elements.

The electro-mechanical transducer according to exemplary embodiments have, for example, the following configurations.

1. An electro-mechanical transducer according to an exemplary embodiment includes a plurality of independent elements, each of which is formed with a first electrode made of oxide on a substrate or foundation film, an electro-mechanical transducer film on the first electrode, and a second electrode made of oxide on the electro-mechanical transducer. An insulative protection film is provided on a surface of the plurality of independent elements and has a first contact hole through which the first electrode is connected to a third electrode and a second contact hole through which the second electrode contacts an external connector. The third electrode made of metal is formed at the first electrode as a common electrode conductive to the first electrode via the first contact hole and common to at least two of the plurality of independent elements (see FIG. 2).

2. An electro-mechanical transducer according to another exemplary embodiment includes a plurality of independent elements, each of which is formed with a first electrode made of oxide on a substrate or foundation film, an electro-mechanical transducer film on the first electrode, and a second electrode made of oxide on the electro-mechanical transducer. An insulative protection film is provided on a surface of the plurality of independent elements and has a first contact hole through which the first electrode is connected to a third electrode and a second contact hole through which the second electrode is connected to a fourth electrode. The third electrode made of metal is formed at the first electrode as a common electrode conductive to the first electrode via the first contact hole and common to at least two of the plurality of independent elements, and the fourth electrode made of metal is formed at the second electrode as an independent electrode conductive to the second electrode of each of the plurality of independent elements via the second contact hole (see FIG. 3).

3. An electro-mechanical transducer according to still another exemplary embodiment includes a plurality of independent elements, each of which is formed with a substrate or foundation film, a first electrode made of oxide on the substrate or foundation film, an electro-mechanical transducer film on the first electrode, and a second electrode made of oxide on the electro-mechanical transducer. A third electrode made of metal is formed at the first electrode as a common electrode conducive to the first electrode and common to at least two of the plurality of independent elements. An insulative protection film is provided on a surface of the plurality of independent elements and has a first contact hole at the third electrode serving as the common electrode, through which the third electrode is connected to an external connector, and a second contact hole at the second electrode serving as the independent electrode, through which the second electrode is connected to an external connector (see FIG. 4).

4. An electro-mechanical transducer according to still another exemplary embodiment includes a plurality of independent elements, each of which is formed with a first electrode made of oxide on a substrate or foundation film, an electro-mechanical transducer film on the first electrode, and a second electrode made of oxide on the electro-mechanical transducer. A third electrode made of metal is formed at the first electrode as a common electrode conducive to the first electrode and common to at least two of the plurality of independent elements, and a fourth electrode made of metal is formed at the second electrode as an independent electrode conductive to the second electrode of each of the plurality of independent elements. An insulative protection film is provided on a surface of the plurality of independent elements and has a first contact hole at the third electrode serving as the common electrode, through which the third electrode is connected to an external connector, and a second contact hole at the second electrode serving as the independent electrode, through which the second electrode is connected to an external connector (see FIG. 4).

Figure 2:
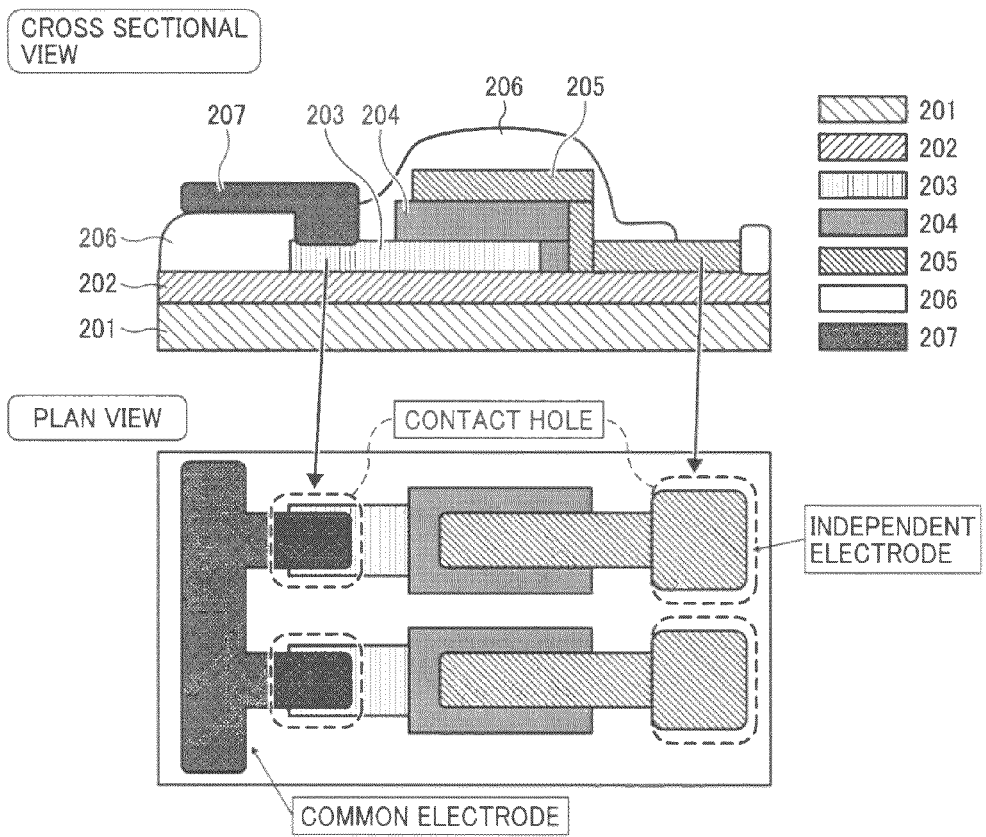
FIG. 2 is a schematic view of an electro-mechanical transducer according to an exemplary embodiment of the present disclosure.

Referring now to the drawings, wherein like reference numerals designate identical or corresponding parts throughout the several views, in particular to FIG. 2, an electro-mechanical transducer according to an exemplary embodiment of the present disclosure is described.

FIG. 2 is a schematic configuration view of the electro-mechanical transducer according to the present exemplary embodiment.

In FIG. 2, the electro-mechanical transducer includes a plurality of independent elements, each of which includes a substrate 201, a diaphragm 202 formed on the substrate 201, a first electrode 203, an electro-mechanical transducer film 204, and a second electrode 205. The electro-mechanical transducer further includes an insulative protection film 206 and a third electrode 207 made of metal formed on the first electrode 203 to electrically conduct the first electrode 203 as a common electrode. That is, the insulative protection film 206 has a contact hole through which the first electrode 203 electrically conducts the third electrode 207. The first electrode 203 and the second electrode 205 are made of oxide.

When, for example, lead zirconate titanate (PZT) is selected as a material of the electro-mechanical transducer film, using oxide electrodes as the first electrode and the second electrode prevents diffusion of lead (Pb) in components of PZT. Further, forming an electrode (metal film) of a metal of low specific resistance as the third electrode allows a desired amount of current to be supplied to the common electrode in voltage driving and a desired amount of displacement to be obtained evenly among the elements.

Figure 3:
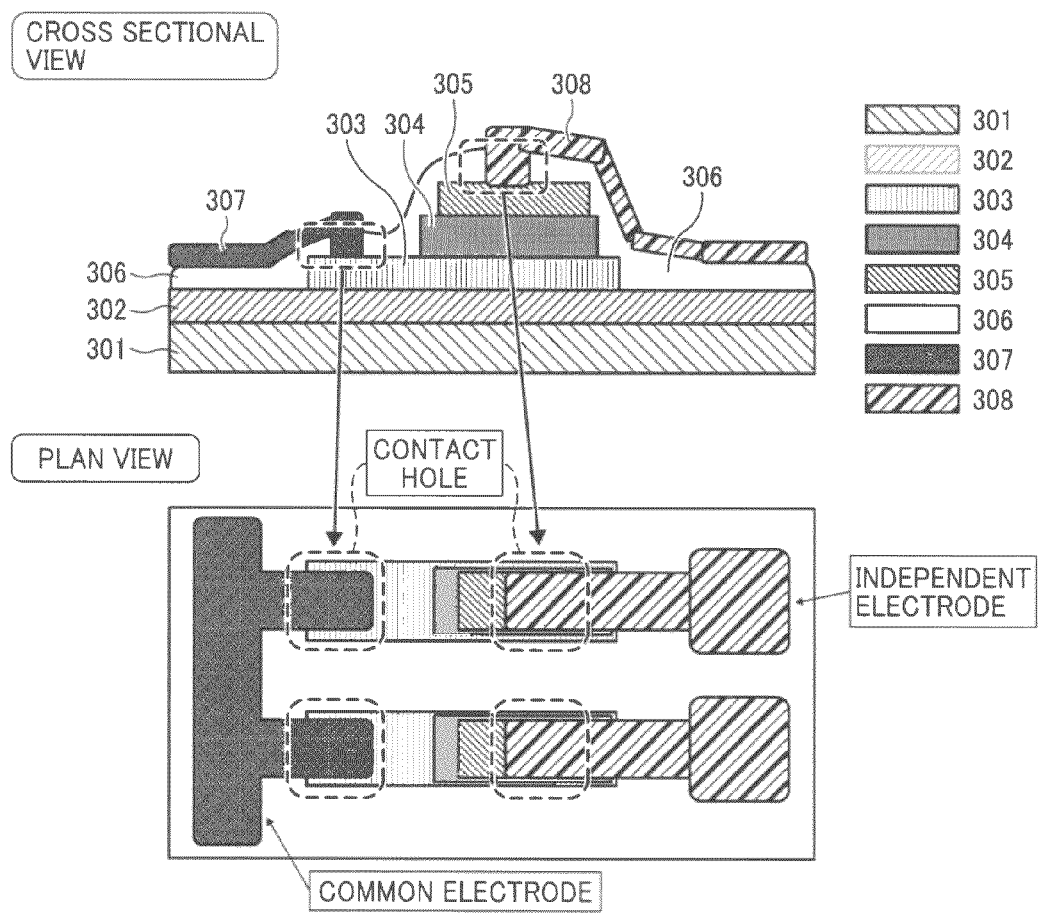
FIG. 3 is a schematic view of an electro-mechanical transducer according to another exemplary embodiment of the present disclosure.

FIG. 3 is a schematic configuration view of an electro-mechanical transducer according to another exemplary embodiment of the present disclosure.

In FIG. 3, the electro-mechanical transducer includes a plurality of independent elements, each of which includes a substrate 301, a diaphragm 302 formed on the substrate 301, a first electrode 303, an electro-mechanical transducer film 304, and a second electrode 305. The electro-mechanical transducer further includes an insulative protection film 306 and a third electrode 307 made of metal formed on the first electrode 303 so as to electrically conduct the first electrode 303 as a common electrode. The electro-mechanical transducer has a contact hole of the insulative protection film 306 on a portion of the second electrode 305 and a fourth electrode 308 made of metal that electrically conducts the second electrode 305 via the contact hole. Each of the first electrode 303 and the second electrode 305 is made of oxide.

Such a configuration illustrated in FIG. 3 allows supplying a desired amount of current to the second electrode 305 serving as an independent electrode and achieving a reduced variance in current among the elements compared to the configuration illustrated in FIG. 2, thereby providing a desired amount of displacement of the electro-mechanical transducer.

Figure 4:
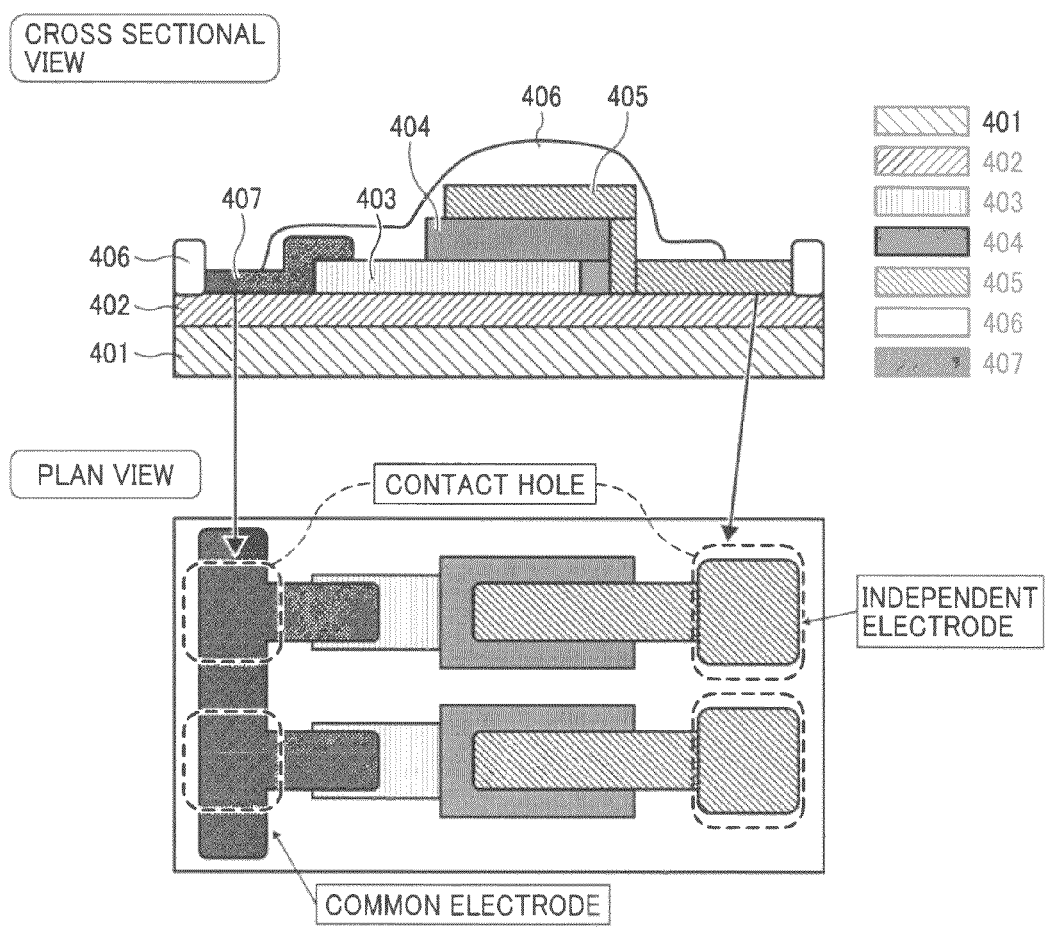
FIG. 4 is a schematic view of an electro-mechanical transducer according to still another exemplary embodiment of the present disclosure.

FIG. 4 is a schematic configuration view of an electro-mechanical transducer according to still another exemplary embodiment of the present disclosure.

In FIG. 4, the electro-mechanical transducer includes a plurality of independent elements, each of which includes a substrate 401, a diaphragm 402 formed on the substrate 401, a first electrode 403, an electro-mechanical transducer film 404, and a second electrode 405. The electro-mechanical transducer further includes an insulative protection film 406 and a third electrode 407 made of metal and formed on the first electrode 403 to electrically conduct the first electrode 403 as a common electrode. Each of the first electrode 403 and the second electrode 405 is made of oxide.

For the configuration illustrated in FIG. 4, after the first electrode 403 is connected to the third electrode 407, the insulative protection film 406 is formed on the third electrode 407. Accordingly, in this configuration, an area covered with the insulative protection film 406 is greater than the configuration illustrated in FIG. 2, more effectively preventing short circuit and damage or breakage of the piezoelectric element due to moisture or gas.

Figure 5:
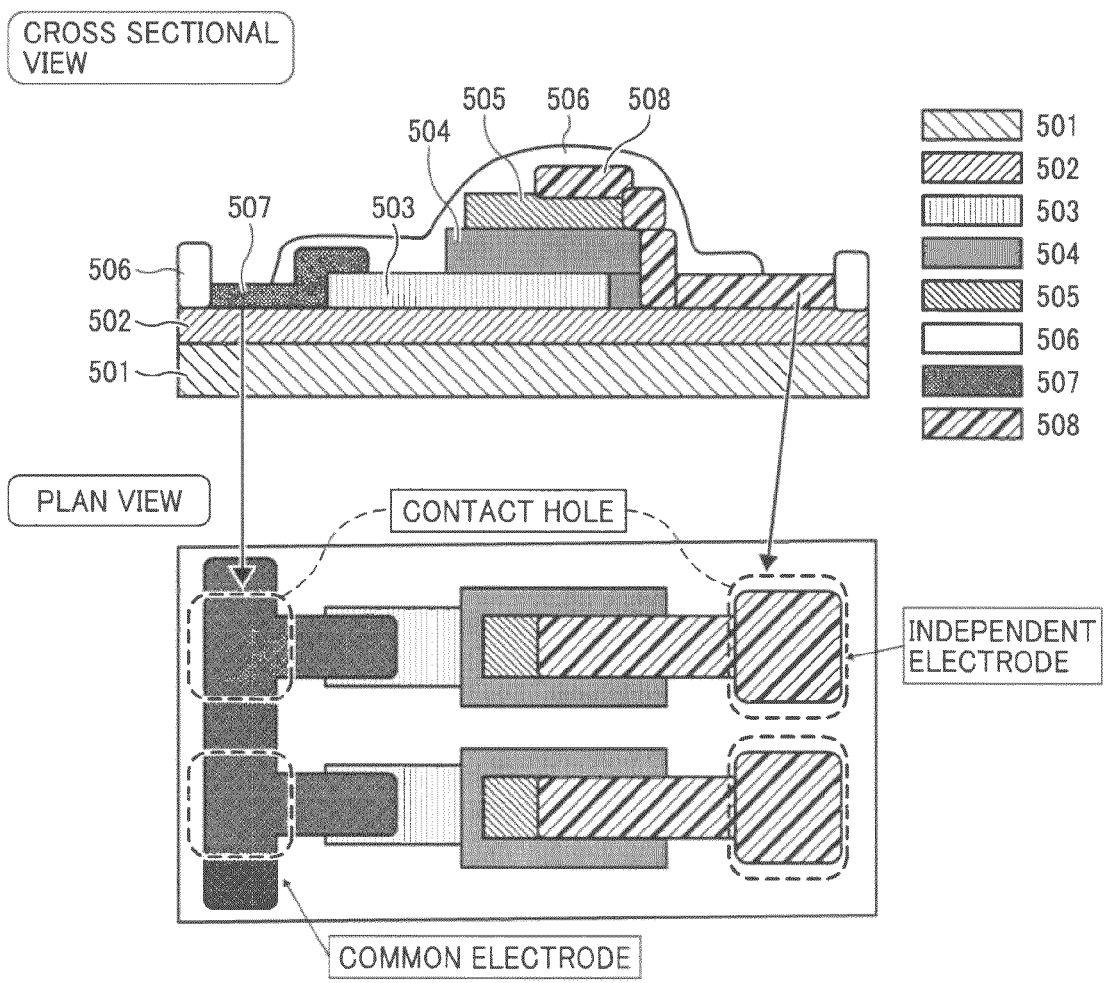
FIG. 5 is a schematic view of an electro-mechanical transducer according to still another and further exemplary embodiment of the present disclosure.

FIG. 5 is a schematic configuration view of an electro-mechanical transducer according to further still another exemplary embodiment of the present disclosure.

In FIG. 5, the electro-mechanical transducer includes a plurality of independent elements, each of which includes a substrate 501, a diaphragm 502 formed on the substrate 501, a first electrode 503, an electro-mechanical transducer film 504, and a second electrode 505. The electro-mechanical transducer further includes an insulative protection film 506, a third electrode 507 that is made of metal and formed on the first electrode 503 so as to electrically conduct the first electrode 503 as a common electrode, and a fourth electrode 508 that is made of metal and formed on the second electrode 505 so as to electrically conduct the second electrode 505 as an independent electrode. The first electrode 503 and the second electrode 505 are made of oxide.

The configuration illustrated in FIG. 5 in which the second electrode 505 is connected to the fourth electrode 508 allows supplying a desired amount of current to the independent electrode and achieving a reduced variance in current among the elements compared to the configuration illustrated in FIG. 4, thereby providing a desired amount of displacement of the electro-mechanical transducer.

That is, for the electro-mechanical transducer according to any of the above-described exemplary embodiments, the third electrode made of a metal of a low specific resistance is connected to at least the second electrode formed as the common electrode. Accordingly, even when a large number of piezoelectric elements is driven at the same time to eject a large number of droplets of ink, the amount of displacement of the piezoelectric elements stabilizes, resulting in an excellent ink-ejection performance. Further, even when the electro-mechanical transducer film includes, for example, PZT which might cause diffusion of lead (Pb) or other failure, using oxide electrodes as the first electrode and the second electrode can suppress a reduction in fatigue properties and maintain an excellent ink-ejection performance.

The electro-mechanical transducer having such excellent ink-ejection properties is useful in an image forming apparatus, such as a printer, a facsimile, a copier, or a multi-functional device having at least two of the foregoing capabilities, a liquid-droplet ejection head of an inkjet recording apparatus used as the image forming apparatus, and a liquid-droplet ejection apparatus including the liquid-droplet ejection head.

Next, materials and manufacturing method of the electro-mechanical transducer are specifically described below.

<Substrate>

The substrate is preferably a silicon monocrystal substrate and has a thickness of 100 μm to 600 μm. There are three types of surface orientation of silicon monocrystal substrate: (100), (110), and (111). In the semiconductor industry, the surface orientation (100) and (111) are widely used. In this configuration, a silicon monocrystal substrate having the surface orientation (100) is mainly used.

In manufacturing a pressure chamber like that illustrated in FIG. 1, a silicon monocrystal substrate is processed by etching. In such a case, anisotropic etching is typically used. Anisotropic etching makes use of a characteristic that etching speed is different in accordance with the surface orientation of crystal structure. For example, in an anisotropic etching of immersing the substrate in an alkaline solution, for example, KOH, the etching speed of the facet (111) is approximately one four-hundredth of the etching speed of the facet (100). Accordingly, for the surface orientation (100), a construct having an inclination of approximately 54 degrees can be produced. By contrast, for the surface orientation (110), a deeper groove can be cut, allowing the arrangement density to be increased while maintaining hardness. In this configuration, a silicon monocrystal substrate having the surface orientation (110) may be used. In such a case, a mask material of $SiO_2$ might be etched, which is to be paid attention in using the surface orientation (110).

<Foundation Member>

As illustrated in FIG. 1, receiving a force created by the electro-mechanical transducer film, a foundation member (diaphragm) 105 deforms to eject ink in the form of droplets from the pressure chamber 101. The foundation member 105 preferably has a predetermined strength. A material including Si, $SiO_2$, or $Si_3N_4$, may be manufactured as the foundation member 105 by a chemical vapor deposition (CVD) method. Further, the material constituting the foundation member 105 preferably has a coefficient of linear expansion close to that of a lower electrode 106 or an electro-mechanical transducer film 107 as illustrated in FIG. 1. In particular, since the electro-mechanical transducer film typically includes PZT, the coefficient of linear expansion of the material constituting the foundation member 105 is properly close to a coefficient of linear expansion of PZT of $8 \times 10^{-6}$(1/K), preferably a coefficient of linear expansion of $5 \times 10^{-6}$(1/K) to $10 \times 10^{-6}$(1/K), and more preferably a coefficient of linear expansion of $7 \times 10^{-6}$(1/K) to $9 \times 10^{-6}$(1/K).

The material constituting the foundation member 105 includes, for example, aluminum oxide, zirconium oxide, iridium oxide, ruthenium oxide, tantalum oxide, hafnium oxide, osmium oxide, rhenium oxide, rhodium oxide, palladium oxide, and compounds of several of the foregoing oxides. The above-mentioned material is manufactured by sputtering or sol-gel processing using, for example, a spin coater.

The thickness of the foundation member 105 is preferably 0.1 μm to 10 μm, more preferably 0.5 μm to 3 μm. If the thickness of the foundation member 105 is smaller than the above-described preferable range, the processing of the pressure chamber illustrated in FIG. 1 may be difficult. By contrast, if the thickness of the foundation member 105 is greater than the above-described preferable range, deformation of the foundation member may be suppressed, thereby causing unstable ejection of ink droplets.

<First Electrode>

As described above, when a composite oxide including lead, such as PZT, is used as the electro-mechanical transducer film, a reaction between lead and the lower electrode or diffusion of lead may occur, thereby degrading piezoelectric properties of the electro-mechanical transducer. Therefore, an electrode material capable of preventing such reaction with lead or diffusion of lead is preferably employed. Hence, in the electro-mechanical transducer according to the present exemplary embodiment, an electrically-conductive oxide is used as the electrode material of the first electrode.

For example, any oxide electrode material selected from among a composite oxide represented by a chemical formula $ABO_3$ (where "A" represents Sr, Ba, Ca, or La and B represents Ru, Co, or Ni), $IrO_2$, and $RuO_2$ may be preferably used.

The composite oxide represented by the chemical formula $ABO_3$ is, for example, $SrRuO_3$, $CaRuO_3$, or $(Sr_{1-x}Ca_x)O_3$ that is a solid solution of $SrRuO_3$ and $CaRuO_3$, or $LaNiO_3$, $SrCoO_3$, or $(La, Sr) (Ni_{1-y}CO_y)O_3$ (y may be 1) which is a solid solution of $LaNiO_3$ and $SrCoO_3$.

Generally, it is conceivable to use platinum having high thermal resistance and low reactivity as the metal member. However, platinum may not have a sufficient barrier property against lead. Hence, the first electrode may be a laminated body of a conductive oxide and a platinum group element, such as iridium or platinum-rhodium, or an alloy film of platinum group elements. For example, after metal materials are laminated, the conductive oxide may be laminated on the laminated metal materials to form the first electrode. Alternatively, when platinum is used as the metal member, a desired adhesion with the foundation member (in particular, $SiO_2$) may not be obtained. Accordingly, Ti, $TiO_2$, Ta, $Ta_2O_5$, or $Ta_3N_5$ is preferably laminated before platinum is laminated. The thickness of the first electrode is preferably 0.05 μm to 1 μm, further preferably 0.1 μm to 0.5 μm.

The first electrode can be manufactured by sol-gel processing using a spin coater. In such a case, a desired pattern is obtained by, for example, photolithographic etching.

Figure 6:
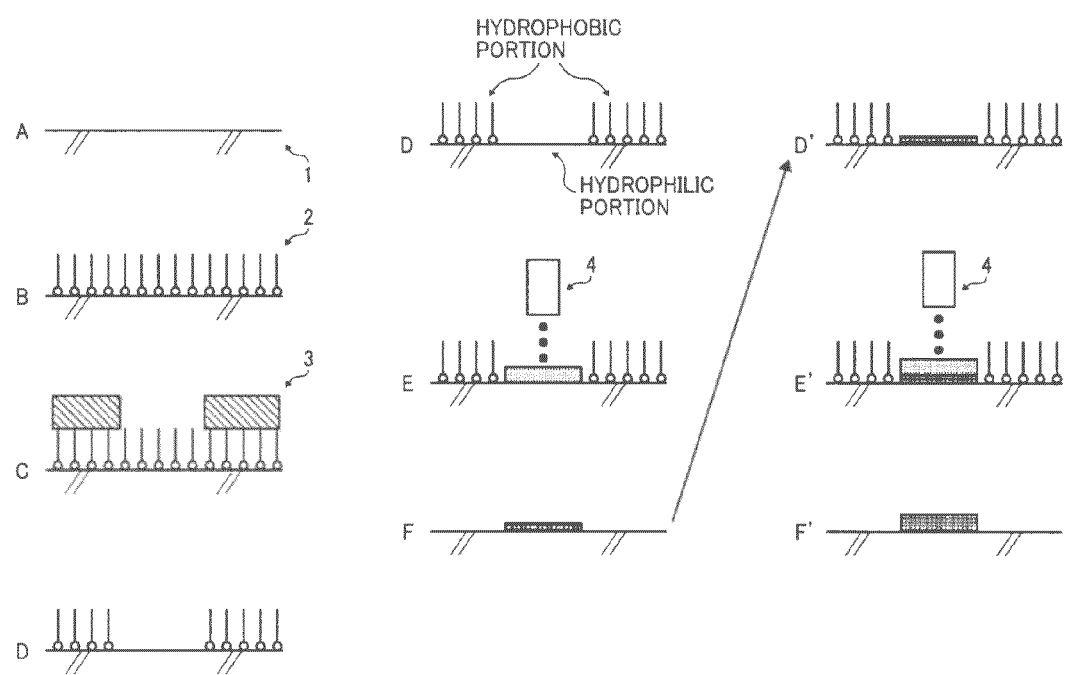
FIG. 6 is a flow diagram illustrating a procedure of forming a patterned film (first electrode) by an inkjet method.

Alternatively, such a patterned film may be obtained by partially modifying the surface of the foundation member according to inkjet processing. With reference to FIG. 6, the inkjet processing is described below.

FIG. 6 is a diagram illustrating a procedure of making the patterned film (the first electrode) by inkjet processing.

As illustrated in Step B of FIG. 6, a solution for forming a self-assembled monolayer (SAM) film is applied to a whole surface of the foundation member 1. The material of the SAM film is selected in accordance with the material of the foundation member 1. When an oxide is employed as the foundation member 1, the SAM film may be made of a silane compound. When the silane compound is used as the SAM film, the solution for forming SAM is prepared by dissolving C6 to C18 molecules, which have different reactivities and hydrophobic properties in accordance with molecular chain length, into an organic solvent, such as alcohol, acetone, or toluene.

The solution for forming SAM is applied to the whole surface of the foundation member 1 by, for example, immersion, evaporation, or spin coating. Extra molecules are replaced and washed by the solvent, and the solution is dried to form the SAM film on the surface of the foundation member 1. Then, as illustrated in Step C of FIG. 6, a photoresist 3 is patterned by photolithography. The SAM film is partially removed by dry etching and the photoresist is removed. Thus, the patterning of the SAM film is completed (see Step D of FIG. 6).

Further, as illustrated in Step E of FIG. 6, using the inkjet processing, a material liquid for forming the first electrode is ejected from an inkjet head 4 to form a first patterning precursor film and treated with heat according to standard sol-gel processing. A precursor of the patterned film is treated at high temperatures of, for example, 300 to 500 degrees C. for burning organic material and 500 to 700 degrees C. for crystallization. Thus, the SAM film is removed (see Step F of FIG. 6). For the inkjet processing, since the thickness of a single layer is approximately 30 nm to approximately 100 nm, several layers may need to be laminated for each film. Accordingly, as illustrated in Step D' and E' of FIG. 6, the above-described procedure is repeated to perform the patterning of the SAM film and make another patterning precursor film. Then, the patterning precursor film is treated with heat to obtain a desired thickness (see Step F' of FIG. 6).

<Electro-Mechanical Transducer Film>

The electro-mechanical transducer film is preferably, but not limited to, a PZT film.

PZT is a solid solution of lead zirconate ($PbZrO_3$) and titanic acid ($PbTiO_3$) and shows different properties in accordance with the proportion of lead zirconate and titanic acid. The composition showing excellent piezoelectric properties is, for example, the proportion of 53:47, which is represented by a chemical formula Pb ($Zr_{0.53}$, $Ti_{0.47}$)$O_3$ or a general expression PZT(53/47).

As a composite oxide other than PZT, for example, barium titanate may be used. In such a case, barium alkoxide and titanic alkoxide may be used as starting materials and dissolved into a common solvent to prepare a precursor solution for barium titanate.

Such starting materials are composite oxide represented by a general formula $CDO_3$ (where C represents Pb, Ba, or Sr and D represents Ti, Zr, Sn, Ni, Zn, Mg, or Nb). Such starting materials are, for example, ($Pb_{1-x}Ba_x$)(Zr, Ti)$O_3$ or ($Pb_{1-x}Sr_x$)(Zr, Ti)$O_3$ in which Pb at site C is partially substituted by Ba or Sr. Such substitution is possible for divalent element and gives an effect of suppressing degradation of piezoelectric properties due to evaporation of lead during heat treatment.

The electro-mechanical transducer film is made by, for example, sputtering or sol-gel processing using a spin coater. In such a case, a desired pattern may be obtained by, for example, photolithographic etching.

When a PZT film is formed as the electro-mechanical transducer film by the sol-gel processing, for example, lead acetate, zirconium alkoxide, or titanate alkoxide is used as a starting material and uniformly dissolved into a common solvent such as methoxy ethanol to prepare a PZT precursor solution. Since a metal alkoxide compound is easily hydrolyzed by moisture in the atmosphere, a proper amount of stabilizer, such as acetylacetone, acetic acid, or diethanolamine may be added to the precursor solution.

In a case in which the PZT film is formed on the whole surface of the foundation member, the PZT precursor solution is applied by spin coating or other solution application method to form a coating film. Then, heat treatment including drying, heat decomposition, and crystallization is performed to form the PZT film. Transformation of the coated film to a crystallized film may cause volume reduction. Accordingly, to prevent cracking of the PZT film, it is preferable to prepare the concentration of the PZT precursor solution so as to obtain a thickness of not more than 100 nm by single processing.

In a case in which the PZT film is made by inkjet processing, a patterned film can be obtained by a procedure similar to the procedure of the first electrode. Different surface modification materials may be used in accordance with the type of the material of the first electrode serving as an underlying layer of the PZT film. In the present exemplary embodiment, since an oxide is the underlying layer of the PZT film, a silane compound is preferably used. Alternatively, in a case in which metal is contained in the underlying layer of the PZT film, alkanethiol may be used.

The thickness of the electro-mechanical transducer film is preferably 0.5 µm to 5 µm, further preferably 1 µm to 2 µm. If the thickness is smaller than 0.5 µm, the electro-mechanical transducer film may not deform with a desired amount. By contrast, if the thickness is more than 5 µm, the number of processing steps may increase, thereby increasing the processing time.

<Second Electrode>

Like the first electrode, in the present exemplary embodiment, the material of the second electrode is an electrically-conductive oxide. In other words, any oxide electrode material selected from among a composite oxide represented by a chemical formula $ABO_3$ (where "A" represents Sr, Ba, Ca, or La and B represents Ru, Co, or Ni), $IrO_2$, and $RuO_2$ may be preferably used.

The composite oxide represented by the chemical formula $ABO_3$ is, for example, $SrRuO_3$, $CaRuO_3$, or $(Sr_{1-x}Ca_x)O_3$ that is a solid solution of $SrRuO_3$ and $CaRuO_3$, or $LaNiO_3$, $SrCoO_3$, or (La, Sr) ($Ni_{1-y}Co_y$)$O_3$ (y may be 1) which is a solid solution of $LaNiO_3$ and $SrCoO_3$.

Generally, it is conceivable to use platinum having high thermal resistance and low reactivity as the metal member. However, platinum may not have a sufficient barrier property against lead. Hence, the second electrode may be a laminated body of the conductive oxide and at least one element of a platinum group element, such as iridium or platinum-rhodium an alloy film of platinum group elements, an Ag alloy, Cu, Al, and Au. The thickness of the second electrode is preferably 0.05 µm to 1 µm, further preferably 0.1 µm to 0.5 µm.

The second electrode can be manufactured by, for example, sputtering or sol-gel processing using a spin coater. In such a case, a desired pattern is obtained by, for example, photolithographic etching.

Alternatively, such a patterned film may be obtained by partially modifying the surface of the foundation member according to inkjet processing. In such a case, the patterned film (the second electrode) is obtained according to, for example, a procedure similar to, if not the same as, the procedure illustrated in FIG. 6. Since the foundation member (the electro-mechanical transducer film) is an oxide, the surface modifying material is preferably a silane compound.

<Insulative Protection Film>

An insulative protection film is provided to prevent malfunction of the piezoelectric element cine to, for example, short circuit or breakage of the piezoelectric element due to moisture or gas. The material of the insulative protection film is preferably, for example, a silicon oxide film, a silicon nitride film, or other inorganic film or polyimide, parylene, or other organic film. The thickness of the insulative protection film is preferably 0.5 µm to 20 µm, further preferably 1 µm to 10 µm. If the thickness is smaller than 0.5 µm, the insulative protection film may not properly carry out its functions. By contrast, if the thickness is more than 10 μm, the processing time for obtaining a desired thickness may increase, which is undesirable.

The insulative protection film can be manufactured by, for example, chemical-vapor deposition (CVD), sputtering, or spin coating. A contact hole is formed to electrically conduct the third electrode with the first electrode or the fourth electrode with the second electrode. For such a contact hole, a desired pattern can be obtained by, for example, photolithographic etching. Alternatively, by screen printing, an insulative protection film having contact holes can be formed by a single process.

A paste material for screen printing is preferably a solution in which resin and either inorganic fillers or organic particles are dissolved or dispersed in an organic solvent.

The resin of the paste material include, for example, polyvinyl alcohol resin, polyvinyl acetal resin, acrylic resin, and/or ethyl cellulose resin. The inorganic filler is, for example, silica ($SiO_2$) Alumina ($Al_2O_3$), titanium oxide ($TiO_2$), zinc oxide (ZnO), barium titanate ($BaTiO_3$), or other inorganic particle. In particular, a material having a low relative permittivity, such as silica ($SiO_2$), Alumina ($Al_2O_3$), or zinc oxide (ZnO), is preferable. In forming such a fine pattern assumed in the present exemplary embodiment, the paste material is filled in a mesh having a wire diameter of 15 μm to 50 μm and an opening ratio of 40% to 60% and transferred to form the film. Accordingly, the fine pattern can be formed together with the contact hole(s).

<Third and Fourth Electrodes>

Each of the third electrode and the fourth electrode preferably includes, for example, an Ag alloy, Cu, Al, Au, Pt, or Ir.

Each of the third electrode and the fourth electrode can be manufactured by forming a predetermined material layer according to, for example, sputtering or spin coating and then forming a desired pattern according to, for example, photolithographic etching.

According to the above-described inkjet processing, a surface of the third electrode or a surface of the fourth electrode serving as its bottom layer is partially modified to form a patterned film, that is, the third electrode or the fourth electrode. In such a case in which the third electrode or the fourth electrode is manufactured by the inkjet processing, the patterned film (the third electrode or the fourth electrode) can be obtained according to a procedure similar to, if not the same as, the procedure described with respect to the first electrode.

In a case in which the bottom layer (the insulative protection film) is an oxide, the surface modifying material is preferably a silane compound. Alternatively, in a case in which an organic material, such as polyimide (PI), is used, ultraviolet ray is emitted to the surface of PI to increase the surface energy of an area on which the ultraviolet ray is emitted. As a result, according to the inkjet processing, in the area of the increased surface energy, the fine pattern of the third electrode or the fourth electrode can be directly drawn. Further, by using PI having a low surface energy, the organic semiconductor layer can be finely patterned. A polymeric material capable of increasing its surface energy with ultraviolet ray may include, for example, a material(s) described in JP-2006-060079-A, which is hereby incorporated by reference herein.

Alternatively, the third electrode or the fourth electrode may be formed by screen printing. In other words, an electrode film (serving as the third electrode or the fourth electrode) can be obtained from a paste material by screen printing. For example, any of the following commercially-available materials may be used as the paste material.

For example, Perfect Gold (registered trademark) (gold paste manufactured by Shinku Yakin Co., Ltd.), Perfect Copper (copper paste manufactured by Shinku Yakin Co., Ltd.), Orgacon Paste variant 1/4 (Printing transparent PEDOT/PSS ink manufactured by Nippon Agfa Gewalt), Paste variant 1/3 (Printing transparent PEDOT/PSS ink manufactured by Agfa-Gevaert Japan Ltd.), Orgacon Carbon Paste variant 2/2 (carbon electrode paste manufactured by Agfa-Gevaert Japan Ltd.), and Baytron (registered trademark) P (PEDT/PSS solution manufactured by H. C. Starck-V TECH Ltd.).

The thickness of each of the third electrode and the fourth electrode is preferably 0.1 μm to 20 μm, more preferably 0.2 μm to 10 μm. If the thickness of the third electrode or the fourth electrode is smaller than 0.1 μm, resistance is relatively large. Consequently, a sufficient amount of current may not be supplied to the third electrode or the fourth electrode, causing unstable ink ejection. By contrast, if the thickness is greater than 20 μm, the processing time for obtaining a desired thickness is relatively long, which is undesirable.

As described above, the method of manufacturing the electro-mechanical transducer according to any of the exemplary embodiments includes, for example, steps of forming a first electrode of oxide on a substrate or foundation film, forming an electro-mechanical transducer film on the first electrode, forming a second electrode of oxide on the electro-mechanical transducer film, and forming a third electrode of metal on the first electrode so that the third electrode electrically conducts the first electrode as a common electrode. Further, the method includes a step of forming, on an element, an insulative protection film having a contact hole through which a metal electrode is connected to the first electrode and/or the second electrode and/or a contact hole through which a metal electrode is connected to an external connector.

Moreover, the method may include a step of forming a fourth electrode of metal on the second electrode so that the fourth electrode electrically conducts the second electrode as an independent electrode.

In this regard, the third electrode and the fourth electrode are preferably formed during the same step, making the electrode manufacturing more efficient.

Each of the first electrode, the second electrode, the third electrode, and the fourth electrode is manufactured as a film by sputtering or spin coating and patterned by photolithographic etching. Thus, by forming each electrode in such a simple way, the electro-mechanical transducer (piezoelectric element) in which a plurality of independent element is arranged in high density can be manufactured.

Alternatively, each of the first to fourth electrodes is preferably patterned by inkjet processing. The patterning by inkjet processing can reduce the number of steps and waste of materials compared to the patterning by photolithographic etching.

Alternatively, the insulative protection film, the third electrode, and the fourth electrode is preferably formed by screen printing. The patterning by screen printing can reduce the number of steps and waste of materials compared to the patterning by photolithographic etching.

The method of manufacturing the electro-mechanical transducer according to any of the exemplary embodiments preferably includes a step of partially modifying a surface of the substrate or foundation film or the insulative protection film. For the surface modification, a thiol compound or silane compound is preferably used. The surface modification allows formation of a desired pattern by inkjet processing.

By forming a contact hole of the insulative protection film by photolithographic etching, an electrode on the insulative protection film can electrically conduct another electrode under the insulative protection film.

Below, the method of manufacturing the electro-mechanical transducer is further described taking an example of the electro-mechanical transducer illustrated in FIG. 2.

The substrate or foundation film on which the first electrode of oxide is formed may be, for example, a silicon wafer. The silicon wafer is provided with a thermally-oxidized film so as to serve as the foundation film. The first electrode is formed on the substrate or foundation film.

In a procedure of forming the first electrode of oxide, an oxide film of, for example, $SrRuO_3$ is formed by sputtering on the substrate or foundation film. Then, a photoresist film is formed by spin coating and patterned by a standard photolithographic processing. A pattern of the first electrode is formed by etching.

Then, an electro-mechanical transducer film is formed on the first electrode. In a procedure of forming the electro-mechanical transducer film, a pattern to be formed is formed on an electro-mechanical transducer film in advance by, for example, SAM processing or resist processing. Using a precursor application liquid, for example, PZT precursor application liquid, the electro-mechanical transducer film is formed by, for example, inkjet processing or screen printing.

Then, a second electrode of oxide is formed on the electro-mechanical transducer film. In a procedure of forming the second electrode, an oxide film of, for example, $SrRuO_3$ is formed on an intermediate construct including the substrate or foundation film, the first electrode, and the electro-mechanical transducer film by, for example, sputtering. Further, a photoresist film is formed on the oxide film by spin coating and patterned by standard photolithographic processing. A pattern of the second electrode is formed by etching.

Next, an insulative protection film having a contact hole through which a metal electrode (the third electrode) is connected to the first electrode and a contact hole through which the second electrode contacts an external connector. In a procedure of forming the insulative protection film, a film of a material for the electro-mechanical transducer film, for example, parylene is formed on an intermediate construct including the substrate or foundation film, the first electrode, the electro-mechanical transducer film, and the second electrode by, for example, CVD. Further, a photoresist film is formed by spin coating and patterned by standard photolithographic processing. A pattern of the second electrode is formed by etching.

Then, the third electrode of metal is formed on the first electrode so that the third electrode electrically conducts the first electrode as a common electrode. In a procedure of forming the third electrode of metal, a metal film of, for example, Al is formed on an intermediate construct including The above-described configuration is an example of the electro-mechanical transducer illustrated in FIG. 2. Although the configurations illustrated in FIGS. 3, 4, and 5 are somewhat different in their processing steps, the electro-mechanical transducer can be manufactured by a method similar to the above-described method like that described below in each of Examples 1 to 6.

Figure 10:
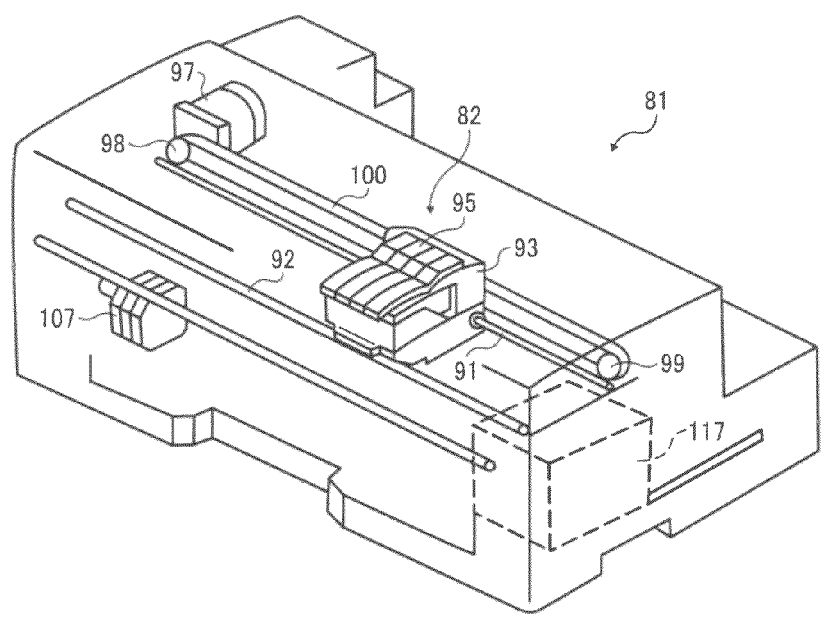
FIG. 10 is a perspective view of an inkjet recording apparatus that has a liquid ejection head (inkjet head) including an electro-mechanical transducer according to an exemplary embodiment of the present disclosure.
Figure 11:
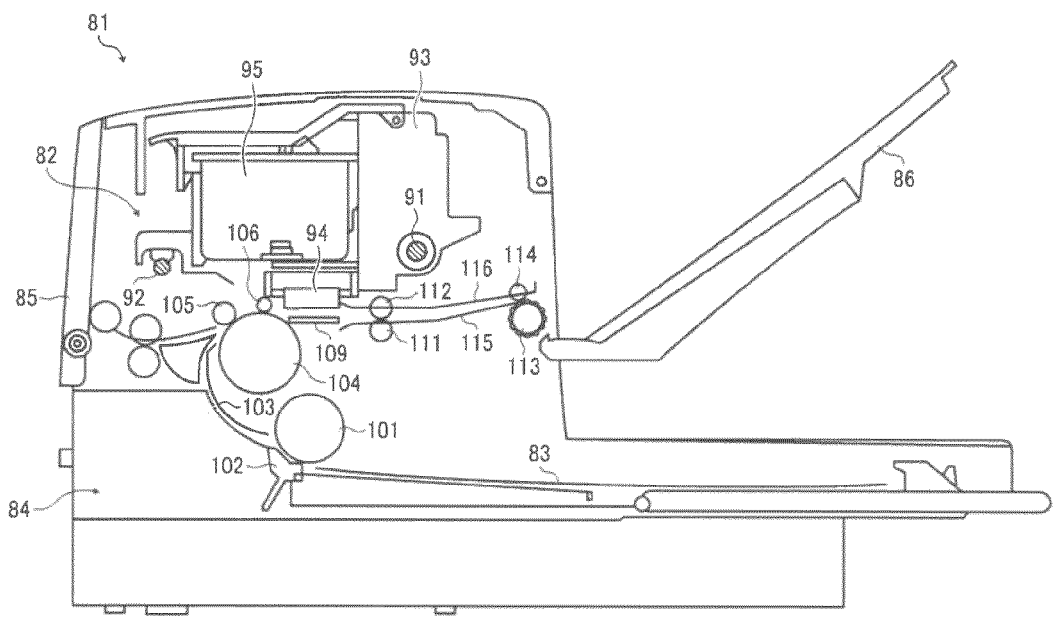
FIG. 11 is a side view of a mechanical portion of the inkjet recording apparatus illustrated in FIG. 10.

Next, an inkjet recording apparatus in which a liquid ejection head (e.g., inkjet head) 81 including an electro-mechanical transducer according to any of the above-described exemplary embodiments is installed is described with reference to FIGS. 10 and 11. FIG. 10 is a perspective view of the inkjet recording apparatus 81. FIG. 11 is a side view of a mechanical section of the inkjet recording apparatus 81.

The inkjet recording apparatus 81 illustrated in FIGS. 10 and 11 includes a print section 82. The print section 82 further includes a carriage 93 movable in a main scan direction, recording heads 94 that are liquid ejection heads (inkjet heads) according to the present exemplary embodiment, and ink cartridges 95 that supply ink to the recording heads 94. At a front lower portion of the inkjet recording apparatus 81, a sheet feed cassette (or sheet feed tray) in which a large number of sheets 83 is loaded from the front side of the inkjet recording apparatus 81 is removably inserted in the inkjet recording apparatus 81. Further, a manual feed tray 85 with which a user manually feeds sheets is pivotably mounted at the front side of the inkjet recording apparatus 81. Receiving a sheet 83 from the sheet feed cassette 84 or the manual feed tray 85, the print section 82 records (forms) an image on the sheet 83 and outputs the sheet 83 to an output tray 86 mounted at the rear side of the inkjet recording apparatus 81.

In the print section 82, the carriage 93 is supported by a main guide rod 91 and a sub guide rod 92 serving as guide members so as to slide in the main scan direction. The main guide rod 91 and the sub guide rod 92 are laterally extended between side plates. On the carriage 93 are mounted the recording heads 94, which are the inkjet heads according to the present example embodiment, to eject ink droplets of different colors, e.g., yellow (Y), cyan (C), magenta (M), and black (Bk). For the recording heads 94, a plurality of nozzle orifices is arranged in a direction perpendicular to the main scan direction so as to eject ink droplets downward. The ink cartridges 95 that supply different color inks to the recording heads 94 are replaceably mounted on the carriage 93.

Each of the ink cartridges 95 has an air release port opened to the atmosphere at an upper portion thereof, a supply port through which ink is supplied to each recording head 94 at a lower portion thereof, and a porous member therein to be filled with ink. Ink supplied to the ink cartridge 95 is kept at a slight negative pressure by a capillary force of the porous member. In the present exemplary embodiment, the recording heads 94 are described as a plurality of recording heads for ejecting different color inks. However, it is to be noted that one recording head may be used to eject droplets of different color inks through separate rows of the nozzle orifices.

The main guide rod 91 is inserted through a rear portion (at the downstream side in the sheet conveyance direction) of the carriage 93 so that the carriage 93 slides on the main guide rod 91. Meanwhile, a front portion (at the upstream side in the sheet conveyance direction) of the carriage 93 is slidably mounted on the sub guide rod 92. To move the carriage 93 for scanning in the main scan direction, a timing belt 100 is extended with tension between a driving pulley 98, which is driven by a main scan motor 97, and a driven pulley 99. The carriage 93 is fixed on the timing belt 100 and reciprocally moved via the timing belt 100 in accordance with forward and reverse rotation of the main scan motor 97.

To feed sheets 83 from the sheet feed cassette 84 below the recording heads 94, the inkjet recording apparatus 81 includes a sheet feed roller 101 and a friction pad 102 to separately feed the sheets 83 from the sheet feed cassette 84, a guide member 103 to guide the sheet 83, a conveyance roller 104 to convey the sheet P while turning around the conveyance direction of the sheet 83, a press roller 105 pressed against the surface of the conveyance roller 104, and a front-end regulation roller 106 to regulate an angle at which the sheet 83 is fed from the conveyance roller 104. The conveyance roller 104 is driven by a sub-scan motor 107 via a gear train.

The inkjet recording apparatus 81 also includes a print receiver 109 serving as a sheet guide member that guides the sheet 83 from the conveyance roller 104 below the recording heads 94 within a moving range of the carriage 93 in the main scan direction. At the downstream side of the print receiver 109 in the sheet conveyance direction are disposed a transport roller 111 and a first spur 112 that are rotated to feed the sheet 83 in the sheet output direction, a sheet output roller 113 and a second spur 114 that feed the sheet 83 to the output tray 86, and guide members 115 and 116 forming a sheet output passage.

During image recording, the inkjet recording apparatus 81 drives the recording heads 94 in accordance with image signals while moving the carriage 93 to eject ink droplets onto the sheet 83 stopped below the recording heads 94. Thus, one band of the desired image is recorded on the sheet P, and after the sheet P is fed by a predetermined distance, another band of the image is recorded. Receiving a recording end signal or a signal indicating that the rear end of the sheet 83 has reached the recording area of the recording heads 94, the recording operation is finished and the sheet 83 is outputted to the output tray 86.

At a position outside the recording area at one end in the moving direction of the carriage 93 is disposed a recovery device 117 that eliminates an ejection failure of the recording heads 94. The recovery device 117 includes a cap unit, a suction unit, and a cleaning unit. In a standby mode, the carriage 93 is positioned above the recovery device 117, and the recording head 94 is capped with the cap unit to keep the moisture of ejection nozzles, thus preventing an ejection failure caused by ink drying. By discharging ink for maintenance during recording, the viscosity of ink in ejection nozzles is kept substantially constant, allowing a stable ejection performance.

If an ejection failure occurs, the cap unit seals the nozzle orifices of the recording heads 94 and the suction unit suctions air bubbles as well as ink from the ejection nozzles. Then, the cleaning unit removes ink or dust adhered at the ejection face of the recording head 94, thus eliminating the ejection failure. The suctioned ink is drained to a waste ink container disposed at a lower portion of the inkjet recording apparatus 81 and absorbed in an ink absorber of the waste ink container.

As described above, the inkjet recording apparatus 81 includes the inkjet head according to any of the above-described illustrative embodiments. Such a configuration can prevent an ejection failure of ink droplets caused by a failure in driving the diaphragm, obtain stable ejection properties, and improve image quality.

EXAMPLES

Below, examples of the electro-mechanical transducer are described in more detail along with comparative examples.

Example 1

A thermally-oxidized film having a thickness of 1 μm is formed on a silicon wafer, and a $SrRuO_3$ film having a thickness of 200 μm is formed on the thermally-oxidized film by sputtering to form a first electrode. Then, a photoresist (for example, TSMR8800 manufactured by TOKYO OHKA KOGYO Co., Ltd.) is coated by spin coating and patterned by standard photolithographic processing. Then, a pattern as illustrated in FIG. 2 is formed by an inductively coupled plasma (ICP) etching apparatus (manufactured by, for example, SAMCO Inc.).

Using octa-(C8)-trychlorosilane (OTS) as a silane compound, the wafer is immersed in a solution (solvent: ethanol) of a concentration of 0.01 mol/l, thereby performing SAM treatment. Then, the wafer is washed with ethanol and dried, and the process goes to the patterning steps illustrated in FIG. 6.

The hydrophobic property after SAM treatment is determined by measuring contact angle. A contact angle of water on the SAM film is, for example, 105.5°. By contrast, a contact angle of water on the $SrRuO_3$ film before SAM treatment is, for example, 44.6°. Thus, it is confirmed that the SAM film treatment has been performed.

Then, a photoresist film (e.g., TSMR8800 manufactured by TOKYO OHKA KOGYO Co., Ltd.) is formed by spin coating and patterned by standard photolithographic processing. A portion at which the SAM film is exposed from the photoresist is removed by oxygen plasma treatment. After the oxygen plasma treatment, a residue of the photoresist is dissolved in acetone for removal. In a way similar to the above-described measurement, the contact angle is measured. The contact angle of a portion at which the SAM film is removed is, for example, 46.2°. By contrast, the contact angle of a portion at which the SAM film is covered with the photoresist is, for example, 104.3°. Thus, it is confirmed that the SAM film has been patterned.

In another patterning method, a photoresist is patterned in advance in a way similar to the above-described way. Further, a SAM film is treated in a way similar to the above-described way, and a residue of the photoresist is dissolved in acetone for removal. Then, the contact angle is measured. The contact angle of water on a portion at which the $SrRuO_3$ film is covered with the photoresist is, for example, 43.6°. By contrast, the contact angle of water on the other portion of the $SrRuO_3$ film is, for example, 105.1°. Thus, it is confirmed that the SAM film has been patterned.

In still another patterning method, ultraviolet rays are applied with a shadow mask. An excimer lamp is used as an ultraviolet light source to apply vacuum-ultraviolet light of a wavelength of 176 nm for 10 minutes. The contact angle of a portion exposed with the vacuum-ultraviolet light is, for example, 42.1°. By contrast, the contact angle of another portion not exposed with the vacuum-ultraviolet light is, for example, 105.3°. Thus, it is confirmed that the SAM film has been patterned.

Next, an electro-mechanical transducer film containing PZT (53/47) is formed on the first electrode by inkjet processing using a PZT precursor application liquid.

Specifically, in the synthesis of the PZT precursor application liquid, acetic acid trihydrate, titanium isopropoxide, and zirconium isopropoxide are used as starting materials. The crystallization water of acetic acid is dissolved in methoxy ethanol and then dehydrated. The amount of lead is in an excess of 10 mol % relative to the stoichiometrical composition to prevent a reduction in crystallinity due to lead evaporation during thermal treatment. Titanium isopropoxide and zirconium isopropoxide are dissolved in methoxy ethanol to provoke an alcohol substitution reaction and esterification reaction and then mixed with a methoxy ethanol solution in which the above-mentioned lead acetate is dissolved, thereby synthesizing a PZT precursor solution. The concentration of PZT is set to, for example, 0.1 mol/l.

Figure 7:
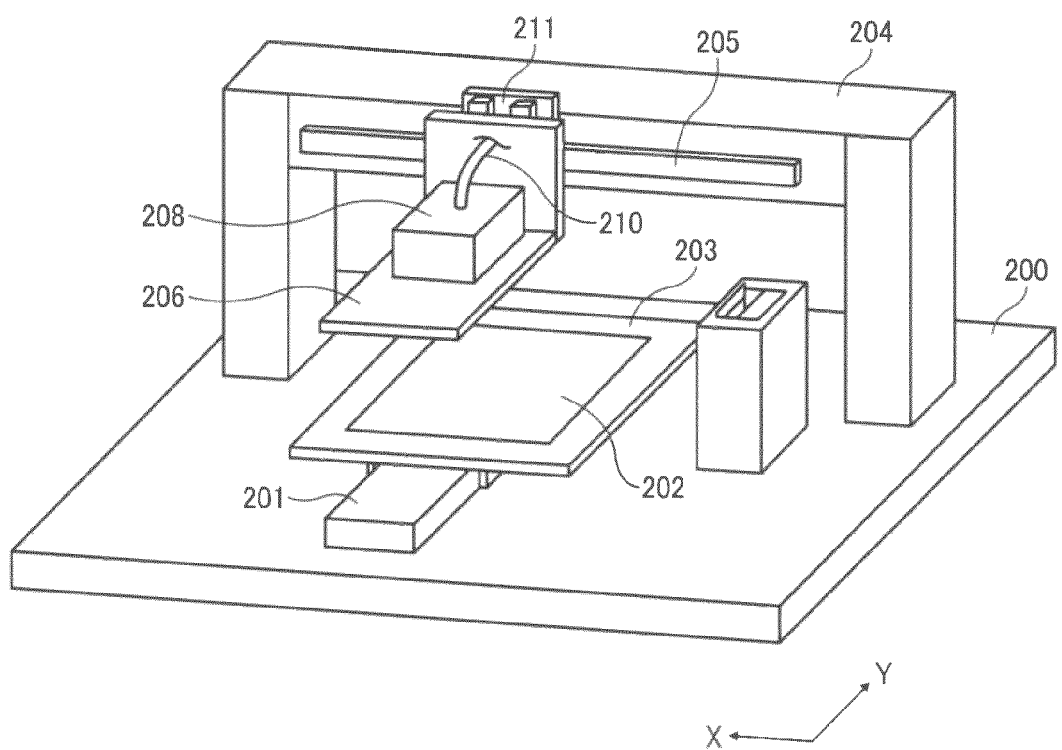
FIG. 7 is a perspective view of an inkjet application apparatus used in Examples.

Then, using an inkjet application device illustrated in FIG. 7, the PZT precursor application liquid is applied to a hydrophilic area (at which the contact angle of water is approximately 44°) patterned in accordance with the steps illustrated in FIG. 6.

FIG. 7 is a perspective view of the inkjet application device used in the present example.

In FIG. 7, a driving unit 201 is disposed on a base 200. A stage 203 on which a board 202 is mounted is disposed on the driving unit 201 so as to be movable in a Y-axis direction. The stage 203 is provided with a vacuum or electrostatic attracting unit, and the board 202 is fixed on the stage 203. An X-axis driving unit 205 is mounted on an X-axis support member 203, and a head base 206 mounted on a Z-axis driving unit 211. The Z-axis driving unit 211 is mounted on the X-axis driving unit 205 so that the head base 206 is movable in an X-axis direction illustrated in FIG. 7. On the head base 206 is mounted an inkjet head 208 that ejects ink. Ink is supplied from respective ink tanks to the inkjet head 208 through tubes 210.

The thickness of coating obtained by a single coating process is preferably approximately 100 nm, and the concentration of the PZT precursor application liquid is optimized in accordance with the relationship between the coating area and the application amount of the PZT precursor application liquid. Step E of FIG. 6 shows a state in which the PZT precursor application liquid is applied by the inkjet application device 4. A contrast (difference) between the contact angles causes the PZT precursor solution to spread only the hydrophilic area, thereby forming a pattern. The solution pattern is heated at 120 degrees C. as primary heating (solvent drying), and then thermal decomposition of organic matter is performed at 500 degrees C. to obtain the state illustrated in the step F of FIG. 6. The thickness of coating is, for example, 90 nm.

After ethanol washing, the above-described immersion and resist processing are repeated to form a patterned SAM film. By repeating the above-described steps six times, the patterned film of a thickness of, for example, 540 nm is obtained and then thermally crystallized at 700 degrees C. by rapid thermal annealing (RAT). Thus, the film can be obtained without cracks or other defects.

Further, the SAM film treatment is repeated six times, and the PZT precursor application liquid is selectively applied to the film. Then, the film is dried at 120 degrees C., thermally decomposed at 500 degrees C., and crystallized. Thus, the film of a thickness of, for example, 1000 nm can be obtained without cracks or other defects.

Next, to form the second electrode on the electro-mechanical transducer film, first, a SrRuO$_3$ film of a thickness of, for example, 200 nm is formed by sputtering. Then, a photoresist (for example, TSMR8800 manufactured by TOKYO OHKA KOGYO Co., Ltd.) is coated by spin coating and patterned by standard photolithographic processing. Further, a pattern as illustrated in FIG. 2 is formed by an ICP etching apparatus (manufactured by, for example, SAMCO Inc.).

Then, a parylene film of a thickness of, for example, 2 μm is formed as an insulative protection film on the above-described construct (having a plurality of independent elements, each of which the first electrode, the electro-mechanical transducer film, and the second electrode are sequentially provided) by a CVD method. Then, a photoresist (for example, TSMR8800 manufactured by TOKYO OHKA KOGYO Co., Ltd.) is coated by spin coating and patterned by standard photolithographic processing. Further, a pattern (an insulative protection film having contact holes) illustrated in FIG. 2 is formed by a reactive ion etching (RIE) apparatus (manufactured by, for example, SAMCO Inc.).

Further, an Al film of a thickness of, for example, 5 μm is formed as a third electrode by sputtering. Then, a photoresist (for example, TSMR8800 manufactured by TOKYO OHKA KOGYO Co., Ltd.) is coated by spin coating and patterned by standard photolithographic processing. Further, a pattern (an insulative protection film having contact holes) illustrated in FIG. 2 is formed by a reactive ion etching (RIE) apparatus (manufactured by, for example, SAMCO Inc.) so that the third electrode of metal (Al) is formed on the first electrode to electrically conduct the first electrode as a common electrode via contact holes. Thus, the electro-mechanical transducer of Example 1 is manufactured.

Example 2

The process up to the formation of the second electrode is performed in a way similar to, if not the same as, the above-described way of Example 1. Then, an Al film of a thickness of, for example, 5 μm is formed as a third electrode by sputtering. Further, a photoresist (for example, TSMR8800 manufactured by TOKYO OHKA KOGYO Co., Ltd.) is coated by spin coating and patterned by standard photolithographic processing. A pattern (an insulative protection film having contact holes) illustrated in FIG. 4 is formed by a reactive ion etching (RIE) apparatus (manufactured by, for example, SAMCO Inc.).

Further, a parylene film of a thickness of, for example, 2 μm is formed as an insulative protection film on the above-described construct by a CVD method. Then, a photoresist (for example, TSMR8800 manufactured by TOKYO OHKA KOGYO Co., Ltd.) is coated by spin coating and patterned by standard photolithographic processing. Then, a pattern illustrated in FIG. 4 is formed by a reactive ion etching (RIE) apparatus (manufactured by, for example, SAMCO Inc.). Thus, the electro-mechanical transducer of Example 2 is manufactured.

Example 3

The process up to the formation of the insulative protection film is performed in a way similar to, if not the same as, the above-described way of Example 1. Then, an Al film of a thickness of, for example, 5 μm is formed as a third electrode and a fourth electrode by sputtering. Further, a photoresist (for example, TSMR8800 manufactured by TOKYO OHKA KOGYO Co., Ltd.) is coated by spin coating and patterned by standard photolithographic processing. A pattern illustrated in FIG. 3 is formed by a reactive ion etching (RIE) apparatus (manufactured by, for example, SAMCO Inc.) so that the third electrode of metal (Al) is formed on the first electrode so as to electrically conduct the first electrode as a common electrode via contact holes and the fourth electrode of metal (Al) is formed on the second electrode so as to electrically conduct the first electrode as an independent electrode via contact holes. Thus, the electro-mechanical transducer of Example 3 is manufactured.

Example 4

The process up to the formation of the second electrode is performed in a way similar to, if not the same as, the above-described way of Example 1. Then, an Al film of a thickness of, for example, 5 μm is formed as a third electrode and a fourth electrode by sputtering. Further, a photoresist (for example, TSMR8800 manufactured by TOKYO OHKA KOGYO Co., Ltd.) is coated by spin coating and patterned by standard photolithographic processing. A pattern illustrated in FIG. 5 is formed by a reactive ion etching (RIE) apparatus (manufactured by, for example, SAMCO Inc.).

Then, a parylene film of a thickness of, for example, 2 μm is formed as an insulative protection film by a CVD method. Then, a photoresist (for example, TSMR8800 manufactured by TOKYO OHKA KOGYO Co., Ltd.) is coated by spin coating and patterned by standard photolithographic processing. Further, a pattern illustrated in FIG. 5 is formed by a reactive ion etching (RIE) apparatus (manufactured by, for example, SAMCO Inc.). Thus, the electro-mechanical transducer of Example 4 is manufactured.

Example 5

A thermally-oxidized film having a thickness of 1 μm is formed on a silicon wafer. Using octa-(C8)-trychlorosilane (OTS) as a silane compound, the wafer is immersed in a solution (solvent: ethanol) of a concentration of 0.01 mol/l, thereby performing SAM treatment. Then, the wafer is washed with ethanol and dried, and the process goes to the patterning steps illustrated in FIG. 6.

The hydrophobic property after SAM treatment is determined by measuring contact angle. A contact angle of water on the SAM film is, for example, 105.5°. By contrast, a contact angle of water on the $SrRuO_3$ film before SAM treatment is, for example, 42.9°. Thus, it is confirmed that the SAM film treatment has been performed.

Then, a photoresist film (e.g., TSMR8800 manufactured by TOKYO OHKA KOGYO Co., Ltd.) is formed by spin coating and patterned by standard photolithographic processing. A portion at which the SAM film is exposed from the photoresist is removed by oxygen plasma treatment. After the oxygen plasma treatment, a residue of the photoresist is dissolved in acetone for removal. When the contact angle is measured in a way similar to the above-described measurement, the contact angle of a portion at which the SAM film is removed is, for example, 46.2°. By contrast, the contact angle of a portion at which the SAM film is covered with the photoresist is, for example, 104.3°. Thus, it is confirmed that the SAM film has been patterned.

Then, a LaNiO3 film is coated by inkjet processing to form a first electrode. In synthesizing a LNO precursor solution for the inkjet processing, lanthanum isopropoxide and bis-(acetylacetonato)nickel(II) hydrate are used as starting materials.

After bis-(acetylacetonato)nickel(II) hydrate is dehydrated, lanthanum isopropoxide and bis-(acetylacetonato) nickel(II) are dissolved in methoxy ethanol to proceed alcohol substitution reaction and esterification reaction. Thus, a $LaNiO_3$ precursor solution is synthesized. The concentration of $LaNiO_3$ in the solution is set to, for example, 0.1 mol/l. The solution is applied to a hydrophilic area by an inkjet application device similar to that of Example 1. A contrast (difference) between contact angles causes the LNO precursor solution to spread only the hydrophilic area, thereby forming a pattern. The solution pattern is heated at 150 degrees C. as primary heating (solvent drying) and then heated in oxygen atmosphere at 400 degrees C. for one hour while increasing the temperature at a rate of, for example, 10° C./min, thereby crystallizing the solution pattern. At this time, the film thickness is, for example, 90 nm. Further, after washing with isopropyl alcohol, immersion treatment is repeated in a way similar to the above-described immersion treatment, thereby forming a SAM film. By repeating the above-described process three times, the film of, for example, 270 nm is formed without cracks or other defects.

Then, in a way similar to that of Example 1, a SAM film is formed on a surface of the foundation member, and an electro-mechanical transducer film is manufactured by inkjet processing.

Further, in a way similar to the way of manufacturing the first electrode, a SAM film is formed on the surface of the foundation member, and a $LaNiO_3$ film is formed by inkjet processing. Thus, the second electrode is manufactured.

A $Si_3N_4$ film of, for example, 2 μm is formed as the insulative protection film by a CVD method. Then, a photoresist (for example, TSMR8800 manufactured by TOKYO OHKA KOGYO Co., Ltd.) is coated by spin coating and patterned by standard photolithographic processing. Further, a pattern (an insulative protection film having contact holes) illustrated in FIG. 3 is formed by a reactive ion etching (RIE) apparatus (manufactured by, for example, SAMCO Inc.).

SAM treatment is performed on a surface of the insulative protection film that serves as an under layer of both a third electrode and a fourth electrode. A commercially-available AgPd ink is printed in a desired pattern by an inkjet application device and heated at 300 degrees C. Accordingly, a pattern illustrated in FIG. 3 is formed so that the third electrode of metal (AgPd) is formed on the first electrode so as to electrically conduct the first electrode as a common electrode via contact holes and the fourth electrode of metal (AgPd) is formed on the second electrode so as to electrically conduct the first electrode as an independent electrode via contact holes. Thus, the electro-mechanical transducer of Example 5 is manufactured.

Example 6

The process up to the formation of the second electrode is performed in a way similar to, if not the same as, the above-described way of Example 5. Then, using a silica paste, an insulative protection film is formed by screen printing.

For preparation of the silica paste used, a polyvinyl butyral resin (manufactured by, e.g., SEKISUI CHEMICAL CO., LTD.) is dissolved in terpineol and butoxyethanol. Then, to obtain a proper printing viscosity of, for example, 60,000 to 2 million mPas, an insulative filler is added to the solution and mixed by, for example, a three-roll mill to prepare as a paste for screen printing. As the insulative filler, for example, a silica filler of an average particle diameter of 0.1 μm is selected and added because even particles are easily obtained.

As a specific prescription, for example, 70 wt % of the silica filler is added to a binder (terpineol and butoxyethanol) having a concentration of 5 wt % of polyvinyl butyral.

The paste obtained by the above-described preparation is screen printed (using a calendar mesh screen of No. 500 having an emulsion thickness of 5 μm) and then dried at 120 degrees C. to form the insulative protection film. It is confirmed that, during formation of the insulative protection film, contact holes of approximately 100 μm×100 μm are formed in the insulative protection film.

Further, a silver paste (manufactured by, for example, Daiken Chemical Co., Ltd.) is screen printed under screen conditions similar to those of the insulative protection film and dried at 120 degrees C. Accordingly, a pattern illustrated in FIG. 3 is formed so that a third electrode of metal (Ag) is formed so as to electrically conduct the first electrode as a common electrode via contact holes and a fourth electrode of metal (Ag) is formed so as to electrically conduct the first electrode as an independent electrode via the contact holes. Thus, the electro-mechanical transducer of Example 6 is manufactured.

Comparative Example 1

The process up to the formation of the insulative protection film is performed in a way similar to, if not the same as, the above-described way of Example 1. Then, a pattern (having a configuration preventing formation of third and fourth electrodes) illustrated in FIG. 8 is manufactured to form an electro-mechanical transducer of the Comparative example 1.

Figure 8:
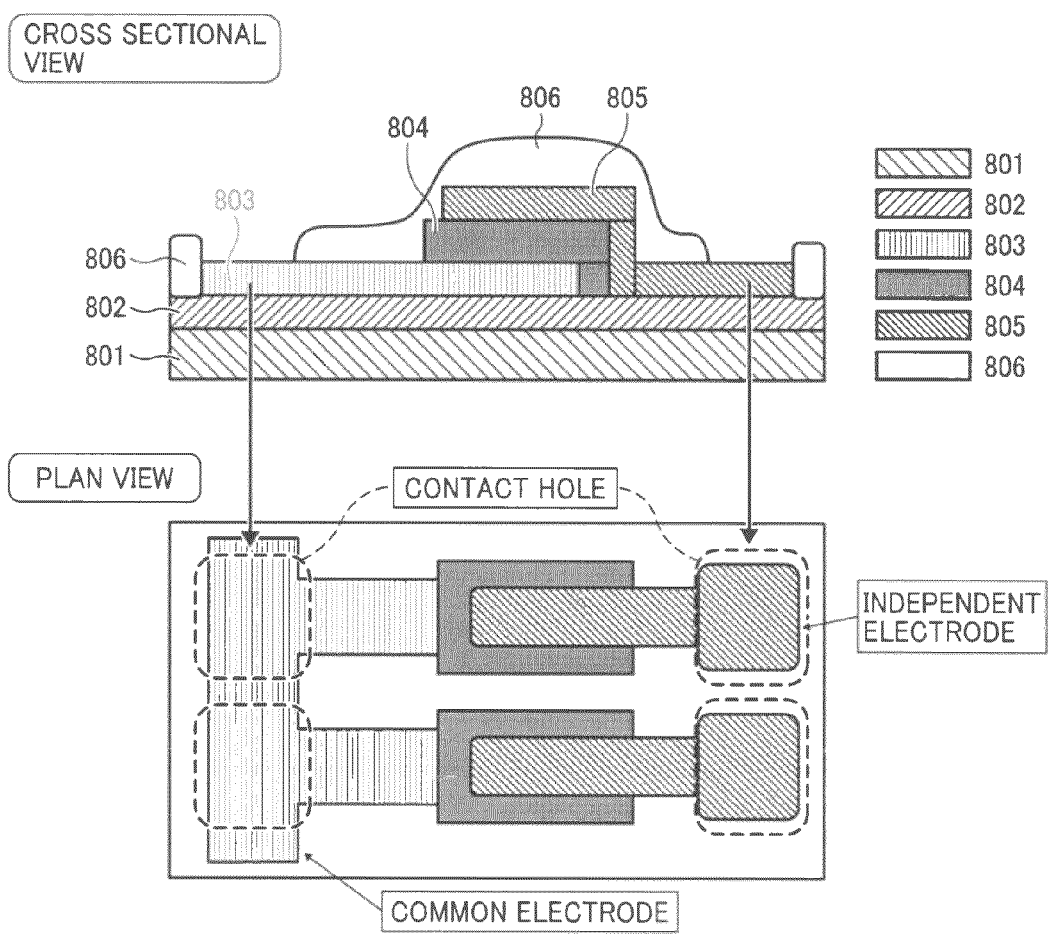
FIG. 8 is a schematic view illustrating a configuration of an electro-mechanical transducer produced in Comparative example 1.

In FIG. 8, the electro-mechanical transducer includes a substrate 801, a diaphragm 802, a first electrode 803, an electro-mechanical transducer film 804, a second electrode 805, and an insulative protection film 806.

Comparative Example 2

A thermally-oxidized film of a thickness of, for example, 1 μm is formed on a silicon wafer. To form a first electrode on the thermally-oxidized film, a Ti film of a thickness of, for example, 50 nm and a Pt film of a thickness of, for example, 200 nm are sequentially formed by sputtering. Then, A thermally-oxidized film having a thickness of 1 μm is formed on a silicon wafer, and a Ti film of a thickness of 50 nm and a Pt film of a thickness of 200 nm are sequentially formed by sputtering to form a first electrode. Then, a photoresist (for example, TSMR8800 manufactured by TOKYO OHKA KOGYO Co., Ltd.) is coated by spin coating and patterned by standard photolithographic processing. Then, a pattern illustrated in FIG. 3 is formed by an inductively coupled plasma (ICP) etching apparatus (manufactured by, for example, SAMCO Inc.). In this regard, it is to be noted that, in Comparative Example 2, both the first electrode and the second electrode are made of metal.

Using alkanethiol, $CH_3(CH_2)_6$—SH, the wafer is immersed in a solution (solvent: ethanol) of a concentration of 0.01 mol/l, thereby performing SAM treatment. Then, the wafer is washed with ethanol and dried, and the process goes to the patterning steps (illustrated in FIG. 6).

The hydrophobic property after SAM treatment is determined by measuring contact angle. A contact angle of water on the SAM film is, for example, 92.2°. By contrast, a contact angle of water on a platinum sputtered film before SAM treatment is, for example, 5° or lower (fully wet). Thus, it is confirmed that the SAM film treatment has been performed.

Then, a photoresist film (e.g., TSMR8800 manufactured by TOKYO OHKA KOGYO Co., Ltd.) is formed by spin coating and patterned by standard photolithographic processing. A portion at which the SAM film is exposed from the photoresist is removed by oxygen plasma treatment. After the oxygen plasma treatment, a residue of the photoresist is dissolved in acetone for removal. When the contact angle is measured in a way similar to the above-described measurement, the contact angle of a portion at which the SAM film is removed is, for example, 5° (fully wet). By contrast, the contact angle of a portion at which the SAM film is covered with the photoresist is, for example, 92.4°. Thus, it is confirmed that the SAM film has been patterned.

Then, a SAM surface is formed on the lower layer in a way similar to, if not the same as, the above-described way of Example 1. An electro-mechanical transducer film containing PZT (53/47) is formed on the first electrode by inkjet processing using a PZT precursor application liquid.

A Pt film having a thickness of 200 nm is formed on the electro-mechanical transducer film by sputtering to form a second electrode on the electro-mechanical transducer film. Then, a photoresist (e.g., TSMR8800 manufactured by TOKYO OHKA KOGYO Co., Ltd.) is coated by spin coating and patterned by standard photolithographic processing. Then, a pattern as illustrated in FIG. 3 (although the first and second electrodes according to the second comparative example are metal) is formed by an inductively coupled plasma (ICP) etching apparatus (manufactured by, for example, SAMCO Inc.).

An insulative protection film, a third electrode, and a fourth electrode are formed in a way similar to, if not the same as, the above-described way of Example 3 to produce the electro-mechanical transducer.

The electro-mechanical transducers according to Examples 1 to 6 and comparative examples 1 and 2 are tested for electrical characteristics and electro-mechanical transduction (piezoelectric constant).

Figure 12:
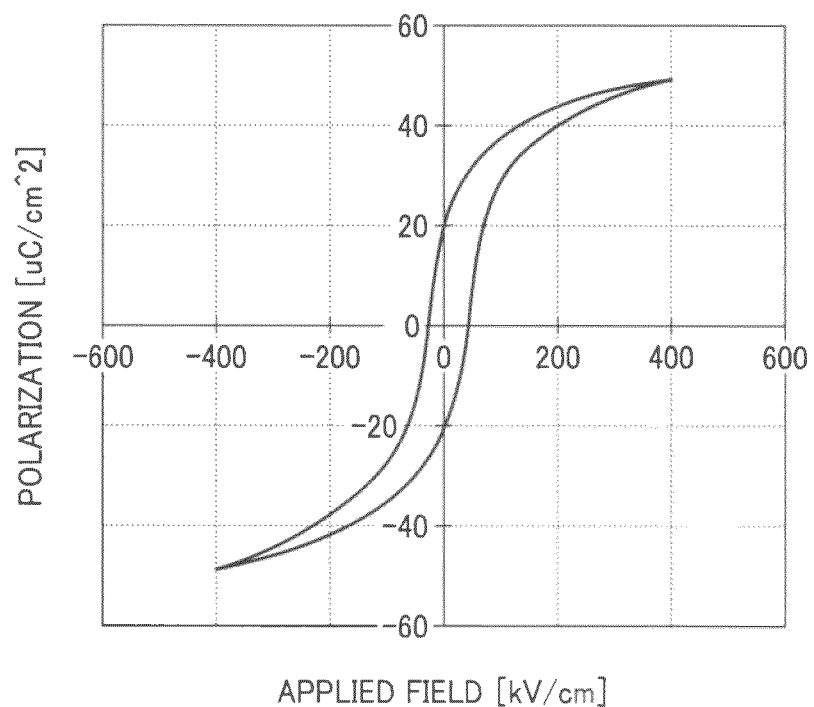
FIG. 12 is a diagram showing a representative P-E hysteresis curve of electro-mechanical transducers produced in Examples.

For initial characteristics, any of the electro-mechanical transducers has a relative permittivity (∈r) of approximately 1200, a dielectric loss (tan θ) of approximately 0.02, a residual polarization (Pr) of 20 to 25 $\mu C/cm^2$, and a coercive electric field (Ec) of 40 to 50 kV/cm, which show characteristics similar to those of typical ceramic sintered body. FIG. 12 shows a representative P-E hysteresis curve.

For the electric-mechanical conversion performance, the amount of deformation caused by applying an electric field is measured by a laser Doppler vibrometer and determined by adjustment through simulation. The piezoelectric constants (d31) obtained for initial characteristics are in a range from −140 to −160 pm/V, which are substantially equal to that of a typical ceramic sintered body and characteristic values allowing design of a liquid ejection head.

For the above-described characteristics, test results of durability (characteristics obtained after a voltage is repeatedly applied $10^{10}$ times) are shown in Tables 1-1 and 1-2.

The electro-mechanical transducers according to Examples 1 to 6 and comparative examples 1 and 2 are used to form liquid ejection heads and tested for ink ejection.

Figure 9:
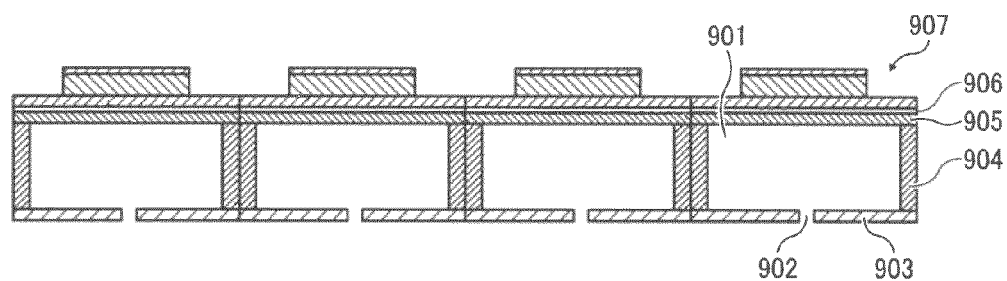
FIG. 9 is a schematic view of a liquid ejection head used in ink ejection tests of Examples.

In FIG. 9, a plurality of units constituting each nozzle of the liquid ejection head illustrated in FIG. 1 is arranged. In FIG. 9, the liquid ejection head includes a pressure chambers 901, nozzles 902, nozzle plates 903, pressure chamber substrates (Si substrates) 904, diaphragms 905, cohesion layers 906, and electro-mechanical transducers 907.

The electro-mechanical transducer 907 illustrated in FIG. 9 is formed in a simple manufacturing process according to an exemplary embodiment of the present disclosure and has capabilities substantially equal to bulk ceramics. After the formation of the electro-mechanical transducer, the pressure chamber 901 is formed by etching a portion of the pressure chamber substrate 904 from its rear side and bonded with the nozzle plate 905 to form the liquid ejection head. In FIG. 9, a liquid supply unit, a liquid passage, and a fluid resistant portion are omitted for simplicity.

Using ink having a viscosity of, e.g., 5 cp, ink ejection is tested when a voltage of −10 to −30V is applied with a simple push waveform.

Test results of the stability of ejection from respective nozzle orifices and the variance of ejection between the nozzle orifices are also shown in Tables 1-1 and 1-2. The evaluation standards are as follows.

[Stability of Ejection from Nozzle Orifices]
A: stable
B: slightly unstable
C: unstable
[Variation of Ejection from Nozzle Orifices]
A: no variations
B: slight variations
C: large variations

TABLE 1-1

| | Initial characteristics | | | | |
|---|---|---|---|---|---|
| Example | Relative permittivity (∈r) | Dielectric loss (tanδ) | Residual polarization (Pr) μC/cm² | Coercive electric field (Ec) kV/cm | Piezoelectric constant (d31) pm/V |
| Example 1 | 1200 | 0.022 | 25 | 40 | −150 |
| Example 2 | 1150 | 0.018 | 22 | 38 | −145 |

TABLE 1-1-continued

| | Initial characteristics | | | | |
|---|---|---|---|---|---|
| Example | Relative permittivity ($\epsilon r$) | Dielectric loss ($\tan\delta$) | Residual polarization (Pr) $\mu C/cm^2$ | Coercive electric field (Ec) kV/cm | Piezoelectric constant (d31) pm/V |
| Example 3 | 1215 | 0.019 | 21 | 42 | −140 |
| Example 4 | 1150 | 0.023 | 24 | 46 | −155 |
| Example 5 | 1240 | 0.024 | 20 | 39 | −162 |
| Example 6 | 1165 | 0.019 | 24 | 42 | −154 |
| Comparative Example 1 | 1182 | 0.021 | 22 | 41 | −152 |
| Comparative Example 2 | 1243 | 0.023 | 24 | 43 | −147 |

TABLE 1-2

| | Durability (after $10^{10}$ times repeat) | | Evaluation of ink ejection by liquid ejection head | |
|---|---|---|---|---|
| Example | Durability (after $10^{10}$ times repeat) | Piezoelectric constant (d31) pm/V | Ejection stability of respective nozzles | Variation among nozzles |
| Example 1 | 24 | −143 | A | A |
| Example 2 | 21 | −138 | A | A |
| Example 3 | 20 | −133 | A | A |
| Example 4 | 23 | −147 | A | A |
| Example 5 | 19 | −154 | A | A |
| Example 6 | 23 | −146 | A | A |
| Comparative Example 1 | 21 | −144 | C | B |
| Comparative Example 2 | 10 | −60 | B | B |

As a result of the above-described test, no large differences are observed in the initial characteristics between the electro-mechanical transducer of Examples 1 to 6 and Comparative examples 1 and 2. However, for the durability (characteristics obtained after a voltage is repeatedly applied $10^{10}$ times), Comparative example 2 (of the first and second electrodes of metal) shows a large shift in the residual polarization (Pr) and piezoelectric constant (d31), which showing deteriorated characteristics.

Further, from the results of the stability of ejection from each nozzle orifices and the variation of ejection among nozzle orifices, Examples 1 to 6 shows excellent ejection characteristics. By contrast, Comparative example 1 shows unstable ejection and variations in a portion of nozzle orifices. Further, Comparative examples 1 and 2 show slight variations among nozzle orifices, which are problematic in ejection characteristics.

As described above, the electro-mechanical transducer according to any of Examples 1 to 6 includes the third electrode of metal that is formed on the first electrode of oxide so as to electrically conduct at least the first electrode. Such a configuration can stabilize the variation amount of piezoelectric elements and achieve excellent characteristics of ink ejection even when a plurality of electro-mechanical transducers (piezoelectric elements) are simultaneously driven together to eject a large number of ink droplets at a time. In particular, in a case in which PZT is used as the electro-mechanical transducer film, such a configuration can suppress dispersion of lead (Pb) and a reduction in fatigue characteristics. Accordingly, even in long-time use, excellent ink-ejection characteristics are maintained.

Photolithographic processing, inkjet processing, screen printing, photolithographic etching, SAM film formation, or other fine processing is applicable to the formation of the electro-mechanical transducer, thereby easily forming densely-arranged elements.

The liquid ejection head including the electro-mechanical transducer according to any of the above-described embodiments and the liquid ejection apparatus including the liquid ejection head are excellent in ejection stability and durability and therefore useful as, for example, an inkjet recording apparatus (for example, an inkjet printer, a digital printing device employing a multi-functional periphery (MFP), an office- or personal-use printer, or a MFP) or three-dimensional molding technology using inkjet technology.

Numerous additional modifications and variations are possible in light of the above teachings. It is therefore to be understood that, within the scope of the appended claims, the present disclosure may be practiced otherwise than as specifically described herein.

With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

For example, elements and/or features of different exemplary embodiments may be combined with each other and/or substituted for each other within the scope of this disclosure and appended claims.

What is claimed is:

1. An electro-mechanical transducer, comprising:
    one of a substrate and a foundation film;
    a first electrode of oxide disposed on the one of the substrate and the foundation film;
    an electro-mechanical transducer film disposed on the first electrode;
    a second electrode of oxide disposed on the electro-mechanical transducer film; and
    a third electrode of metal formed on the first electrode as a common electrode conductive to the first electrode, wherein the width of the first electrode is longer than the width of the electro-mechanical transducer film, wherein
    the electro-mechanical transducer comprises plural elements, each including an individual electro-mechanical transducer film and an individual second electrode, and
    the third electrode is common to at least two of the plural elements.

2. The electro-mechanical transducer according to claim 1, further comprising:
    an insulation film provided on a surface of the second electrode, wherein the insulation film has a first hole at the first electrode, through which the first electrode is connected to the third electrode and a second hole at the second electrode, through which the second electrode contacts an external connector, and the third electrode is conductive to the first electrode through the first hole.

3. The electro-mechanical transducer according to claim 1, further comprising:
    a fourth electrode of metal formed on the second electrode as an independent electrode conductive to the second electrode; and
    an insulation film provided on a surface of the second electrode, wherein the insulation film has a first hole at the first electrode, through which the first electrode is connected to the third electrode, and a second hole at the second electrode, through which the fourth electrode is connected to the second electrode, and the third electrode is conductive to the first electrode through the first hole and the fourth electrode is conductive to the second electrode through the second hole.

4. The electro-mechanical transducer according to claim 1, further comprising:
an insulation film provided on a surface of the second electrode, wherein the second electrode is formed as an independent electrode and the insulation film has a first hole at the third electrode, through which the third electrode contacts an external connector, and a second hole at the second electrode, through which the second electrode contacts an external connector.

5. The electro-mechanical transducer according to claim 1, further comprising:
a fourth electrode of metal formed on the second electrode as an independent electrode conductive to the second electrode; and
an insulation film provided on a surface of the fourth electrode, wherein the insulation film has a first hole at the third electrode, through which the third electrode contacts an external connector, and a second hole at the fourth electrode, through which the fourth electrode contacts an external connector.

6. The electro-mechanical transducer according to claim 1, wherein the electro-mechanical transducer film is a lead zirconate titanate film.

7. The electro-mechanical transducer according to claim 1, wherein each of the first electrode and the second electrode comprises one material selected from the group consisting of $IrO_2$, $RuO_2$, and a composite oxide represented by a chemical formula $ABO_3$, where A represents Sr, Ba, Ca, or La, and B represents Ru, Co, or Ni.

8. The electro-mechanical transducer according to claim 1, wherein at least one of the third electrode and the fourth electrode comprises one material selected from the group consisting of Ag alloy, Cu, Al, Au, Pt, and Ir.

9. The electro-mechanical transducer according to claim 2, wherein the insulation film is an inorganic film selected from the group consisting of a silicon oxide film, a silicon nitride film, and an oxidized silicon nitride film or an organic film selected from the group consisting of a polyimide film and a parylene film.

10. The electro-mechanical transducer according to claim 2, wherein the insulation film comprises a resin and a filler.

11. A liquid ejection head comprising an electro-mechanical transducer, the electro-mechanical transducer comprising:
one of a substrate and a foundation film;
a first electrode of oxide disposed on the one of the substrate and the foundation film;
an electro-mechanical transducer film disposed on the first electrode;
a second electrode of oxide disposed on the electro-mechanical transducer film; and
a third electrode of metal formed on the first electrode as a common electrode conductive to the first electrode, wherein the width of the first electrode is longer than the width of the electro-mechanical transducer film, wherein
the electro-mechanical transducer comprises plural elements, each including an individual electro-mechanical transducer film and an individual second electrode, and
the third electrode is common to at least two of the plural elements.

12. A liquid ejection apparatus comprising the liquid ejection head according to claim 11.

13. An image forming apparatus, comprising:
at least one roller to transport a recording medium; and
an inkjet recording head which comprises a transducer including:
one of a substrate and a foundation film;
a first electrode of oxide disposed on the one of the substrate and the foundation film;
an electro-mechanical transducer film disposed on the first electrode;
a second electrode of oxide disposed on the electro-mechanical transducer film; and
a third electrode of metal formed on the first electrode as a common electrode conductive to the first electrode, wherein the width of the first electrode is longer than the width of the electro-mechanical transducer film, wherein
the electro-mechanical transducer comprises plural elements, each including an individual electro-mechanical transducer film and an individual second electrode, and
the third electrode is common to at least two of the plural elements.

14. The image forming apparatus of claim 13, further comprising:
a motor, connected to the inkjet recording head, to move the inkjet recording head.

15. The image forming apparatus of claim 14, further comprising:
a belt connected between the motor and the inkjet recording head.

16. The image forming apparatus of claim 13, further comprising:
a tank, connected to the inkjet recording head, which stores ink for use by the inkjet recording head.

17. The image forming apparatus of claim 16, further comprising:
a tube connected between the inkjet recording head and the tank.

* * * * *